United States Patent
Nakayama et al.

(10) Patent No.: US 7,652,482 B2
(45) Date of Patent: *Jan. 26, 2010

(54) NETWORK ANALYZER, NETWORK ANALYZING METHOD, AUTOMATIC CORRECTOR, CORRECTING METHOD, PROGRAM, AND RECORDING MEDIUM

(75) Inventors: Yoshikazu Nakayama, Saitama (JP); Masato Haruta, Saitama (JP)

(73) Assignee: Advantest Corporation, Tokyo (JP)

( * ) Notice: Subject to any disclaimer, the term of this patent is extended or adjusted under 35 U.S.C. 154(b) by 904 days.

This patent is subject to a terminal disclaimer.

(21) Appl. No.: 10/511,544

(22) PCT Filed: Apr. 17, 2003

(86) PCT No.: PCT/JP03/04892

§ 371 (c)(1),
(2), (4) Date: Aug. 19, 2005

(87) PCT Pub. No.: WO03/087856

PCT Pub. Date: Oct. 23, 2003

(65) Prior Publication Data

US 2006/0005065 A1     Jan. 5, 2006

(30) Foreign Application Priority Data

Apr. 17, 2002   (JP) ............................ 2002-115265

(51) Int. Cl.
*G01R 31/11*   (2006.01)
*G01R 35/00*   (2006.01)

(52) U.S. Cl. ........................ 324/534; 324/601; 702/58

(58) Field of Classification Search ................. 324/534, 324/601
See application file for complete search history.

(56) References Cited

U.S. PATENT DOCUMENTS

| | | | | |
|---|---|---|---|---|
| 6,018,246 A * | 1/2000 | Dunsmore et al. | ........... | 324/638 |
| 6,147,501 A * | 11/2000 | Chodora | ..................... | 324/601 |
| 6,347,382 B1 * | 2/2002 | Nakayama et al. | ............. | 714/37 |
| 6,397,160 B1 * | 5/2002 | Craig et al. | .................. | 324/601 |
| 6,421,624 B1 * | 7/2002 | Nakayama et al. | ........... | 324/601 |
| 6,496,785 B1 * | 12/2002 | Nakayama et al. | ........... | 324/601 |
| 6,606,583 B1 * | 8/2003 | Sternberg et al. | ............ | 324/616 |
| 6,614,237 B2 * | 9/2003 | Ademian et al. | ............. | 324/601 |

FOREIGN PATENT DOCUMENTS

| JP | 10-82808 A | 3/1998 |
|---|---|---|
| JP | 10-132914 A | 5/1998 |

(Continued)

*Primary Examiner*—Timothy J Dole
(74) *Attorney, Agent, or Firm*—Young & Thompson

(57) ABSTRACT

The error of a measurement system can be corrected even if the frequency of an input signal of a device under test is different from that of the output signal. A signal output acquiring section acquires the power of the input signal by a power meter not shown in the drawing. Thus, errors due to frequency tracking can be separated depending on the direction in a signal flow graph. Since a receiver measures the parameter concerning the received signal when a signal source is directly connected to a receiver, the measurement system error factor of the receiver can be acquired. The parameter of a device under test can be measured while the error is corrected when the results of measurement, concerning the device under test of receivers are combined.

37 Claims, 29 Drawing Sheets

FOREIGN PATENT DOCUMENTS

| | | |
|---|---|---|
| JP | 11-38054 A | 2/1999 |
| JP | 11-118853 A | 4/1999 |
| JP | 11-211766 A | 8/1999 |
| JP | 11-352163 A | 12/1999 |
| JP | 2001-153904 A | 6/2001 |
| JP | 2002-57530 A | 2/2002 |

* cited by examiner

NETWORK ANALYZER, NETWORK ANALYZING METHOD, AUTOMATIC CORRECTOR, CORRECTING METHOD, PROGRAM, AND RECORDING MEDIUM

RELATED APPLICATIONS

The present application is based on International Application No. PCT/JP03/04892, filed Apr. 17, 2003, and claims priority from, Japanese Application Number 2002-115265, filed Apr. 17, 2002, the disclosure of which is hereby incorporated by reference herein in its entirety.

TECHNICAL FIELD

The present invention relates to a network analyzer adapted to calculate and measure circuit parameters of a device under test.

BACKGROUND ART

It has conventionally been implemented to measure circuit parameters (S parameters for example) of device under test (DUT). A method for measuring circuit parameters of a device under test (DUT) according to prior art will hereinafter be described with reference to FIG. 20.

A signal with a frequency of f1 is transmitted from a signal source 110 through a DUT 200 to a receiving section 120. This signal is received by the receiving section 120. It is assumed that the frequency of the signal received by the receiving section 120 is f2. The S parameters and frequency characteristics of the DUT 200 can be acquired by measuring the signal received by the receiving section 120.

In the case above, there occur measurement system errors in the measurement caused by, for example, a mismatch between measurement systems such as the signal source 110 and the DUT 200. These measurement system errors are, for example, an error due to the directionality of bridges as Ed, an error due to frequency tracking as Er, and an error due to source matching as Es. A signal flow graph in regard to the signal source 110 in the case of a frequency equality f1=f2 is shown in FIG. 21. RF IN indicates a signal that is input from the signal source 110 to the DUT 200, etc., S11m the S parameter of the DUT 200, etc. obtained from a signal reflected from the DUT 200, etc., and S11a the true S parameter of the DUT 200, etc. without any measurement system errors.

In the case of a frequency equality f1=f2, it is possible to correct errors in such a way as described in, for example, Japanese Patent Laid-Open Publication No. Hei. 11-038054. This kind of correction is called calibration. An outline of calibration will now be given. A correction kit is connected to the signal source 110 to achieve three kinds of conditions of opening, shorting and loading (standard loading Z0). Signal reflected from the correction kit above is acquired by the bridge to obtain three kinds of S parameters (S11m) corresponding to the three kinds of conditions. Then, the three kinds of variables Ed, Er and Es are obtained from the three kinds of S parameters.

However, there can be a case where the frequency f1 is not equal to the frequency f2. For example, the case is where the DUT 200 is a device having frequency conversion functions such as a mixer. In such a case, it is impossible to correct errors in such a calibration as above. A signal flow graph in regard to the signal source 110 in the case where the frequency f1 is not equal to the frequency f2 is shown in FIG. 22. Ed and Es flow in the same manner as the case where the frequency f1 is equal to the frequency f2, while Er is divided into Er1 and Er2. In such a calibration as above are obtained only three kinds of S parameters (S11m), and thus Ed, Es and Er1·Er2 only can be obtained. Therefore, it is impossible to obtain Er1 and Er2.

Further, in the case where the frequency f1 is not equal to the frequency f2, measurement system errors due to the receiving section 120 cannot also be ignored. A signal flow graph in the case of a direct coupling of the signal source 110 and the receiving section 120 is shown in FIG. 23. S2lm is the S parameter of the DUT 200, etc. obtained from a signal received by the receiving section 120. As shown in FIG. 23, there occur measurement system errors such as Et and EL due to the receiving section 120. These cannot also be obtained in such a calibration as above.

Accordingly, in the case where the frequency f1 is not equal to the frequency f2, measurement system errors cannot be obtained and approximate values including errors are to be measured.

Hence, it is a subject of the present invention to make it possible to correct measurement system errors even in the case where the frequency of an input signal of a device under test is different from that of the output signal thereof.

DISCLOSURE OF THE INVENTION

According to the present invention as described a network analyzer includes: an input signal measuring element for measuring a predetermined parameter concerning an input signal before the occurrence of measurement system error factors; a reflected signal measuring element for measuring a predetermined parameter concerning a reflected signal for the input signal; a signal output acquiring element for acquiring the predetermined parameter concerning the input signal after the occurrence of the measurement system error factors; and a measurement system error factor acquiring element for acquiring the measurement system error factors based on the measurement results of the input signal measuring element, the reflected signal measuring element and the signal output acquiring element.

The signal output acquiring element acquires the predetermined parameter concerning the input signal after the occurrence of the measurement system error factors. This allows errors, etc. due to frequency tracking to be separated depending on the direction thereof.

In the case where the frequency of an input signal of a device under test is different from that of the output signal thereof, errors, etc. due to frequency tracking vary depending on the direction thereof. Therefore, it is possible to correct measurement system errors by separating the measurement system error factors depending on the direction thereof.

The present invention as previously described is a network analyzer wherein the reflected signal measuring element measures the predetermined parameter concerning the reflected signal for the input signal reflected from a correction tool connected to the network analyzer, the correction tool achieving three kinds of conditions of opening, shorting and standard loading.

The present invention as previously described is a network analyzer that further includes a receiving element for receiving the input signal, after being output, as a received signal, the receiving element having a received signal measuring element for measuring a predetermined parameter concerning the received signal, wherein the measurement system error factor acquiring element acquires measurement system error factors based on the measurement results of the input signal measuring element, the reflected signal measuring element, the signal output acquiring element and the received signal measuring element.

The received signal measuring element measures the predetermined parameter (S parameter for example) concerning the received signal, which makes it possible to acquire the measurement system error factor of the receiving element.

In the case where the frequency of an input signal of a device under test is different from that of the output signal thereof, the measurement system error factor of the receiving element cannot be ignored. Therefore, it is possible to correct measurement system errors by acquiring the measurement system error factor of the receiving element.

The present invention as previously described is a network analyzer wherein the reflected signal measuring element measures a predetermined parameter concerning a reflected signal for the input signal reflected from a device under test, and wherein the receiving element receives the input signal, after being output, through the device under test as the received signal, further including a parameter measuring element for measuring predetermined parameters concerning the device under test based on the measurement results, concerning the device under test, of the input signal measuring element, the reflected signal measuring element and the received signal measuring element, and the measurement system error factors.

As the measurement system error factors are separated depending on the direction thereof and further the measurement system error factor of the receiving element is acquired, in combination with the measurement results, concerning the device under test, of the input signal measuring element, the reflected signal measuring element and the received signal measuring element, it is possible to measure the predetermined parameters (S parameters for example) concerning the device under test while correcting errors.

The present invention as previously described is a network analyzer wherein the receiving element includes: a receiving side input signal measuring element for measuring a predetermined parameter concerning the input signal before the occurrence of measurement system error factors; a receiving side reflected signal measuring element for measuring a predetermined parameter concerning a receiving side reflected signal for the input signal after being output from the receiving element and being reflected; a receiving side signal output acquiring element for acquiring the predetermined parameter concerning the input signal after the occurrence of the measurement system error factors; and a receiving side measurement system error factor acquiring element for acquiring the measurement system error factors based on the measurement results of the receiving side input signal measuring element, the receiving side reflected signal measuring element and the receiving side signal output acquiring element.

The receiving side signal output acquiring element acquires the predetermined parameter (S parameter for example) concerning the input signal after the occurrence of the measurement system error factors. This allows errors, etc. due to frequency tracking to be separated on the receiving side depending on the direction thereof.

In the case where the frequency of an input signal of a device under test is different from that of the output signal thereof, errors, etc. due to frequency tracking vary depending on the direction thereof also on the receiving side. Therefore, it is possible also on the receiving side to correct measurement system errors by separating the measurement system error factors depending on the direction thereof.

The present invention as previously described is a network analyzer wherein the receiving side reflected signal measuring element is the received signal measuring element.

The present invention as previously described is a network analyzer wherein the receiving side reflected signal measuring element measures the predetermined parameter concerning the reflected signal for the input signal reflected from a correction tool connected to the network analyzer, the correction tool achieving three kinds of conditions of opening, shorting and standard loading.

The present invention as previously described is a network analyzer wherein the reflected signal measuring element measures a predetermined parameter by receiving the input signal after being output from the receiving element, and wherein the receiving side measurement system error factor acquiring element acquires measurement system error factors based on the measurement results of the receiving side input signal measuring element, the receiving side reflected signal measuring element, the receiving side signal output acquiring element and the reflected signal measuring element.

The reflected signal measuring element measures the predetermined parameter (S parameter for example) receiving the input signal after being output from the receiving element, which makes it possible to acquire the measurement system error factors in the case of receiving the signal on the side of the signal outputting element.

In the case where the frequency of an input signal of a device under test is different from that of the output signal thereof, the measurement system error factors in the case of receiving the signal on the side of the signal outputting element cannot be ignored. Therefore, it is possible to correct measurement system errors by acquiring the measurement system error factors in the case of receiving the signal on the side of the signal outputting element.

The present invention as previously described is a network analyzer wherein in the case the input signal is given to a device under test directly, the reflected signal measuring element measures a predetermined parameter concerning a reflected signal for the input signal reflected from the device under test and the receiving element receives the input signal, after being output, through the device under test as the received signal, and wherein in the case the input signal is given to the device under test through the receiving element, the receiving side reflected signal measuring element measures a predetermined parameter concerning a receiving side reflected signal for the input signal reflected from the device under test and the reflected signal measuring element measures a predetermined parameter by receiving the input signal, after being output from the receiving element, through the device under test, further including a parameter measuring element for measuring predetermined parameters concerning the device under test based on: the measurement results, concerning the device under test, of the input signal measuring element, the reflected signal measuring element and the received signal measuring element in the case the input signal is given to the device under test directly; the measurement results, concerning the device under test, of the receiving side input signal measuring element, the receiving side reflected signal measuring element and the reflected signal measuring element in the case the input signal is given to the device under test through the receiving element; and the measurement system error factors.

When the input signal is given to the device under test directly from the signal outputting element, the measurement system error factors are separated depending on the direction thereof and further the measurement system error factor of the receiving element is acquired. Additionally, when the input signal is given to the device under test through the receiving element, the measurement system error factors are separated also on the receiving side and further the measurement system error factors in the case of receiving the signal on the side of the signal outputting element are acquired. Therefore, in combination with the measurement results concerning the device under test, it is possible to measure the predetermined parameters (S parameters for example) concerning the device under test while correcting errors.

The present invention as previously described is a network analyzer that further includes a selecting element for selecting whether the input signal is given to the device under test directly or through the receiving element.

The present invention as previously described is a network analyzer wherein the frequency of an input signal of the device under test is different from that of the output signal thereof. The present invention as previously described is a network analyzer wherein the device under test is a mixer.

The present invention as previously described is a network analyzer wherein the predetermined parameters are S parameters or powers.

According to the present invention as described a network analyzing method includes: an input signal measuring step for measuring a predetermined parameter concerning an input signal before the occurrence of measurement system error factors; a reflected signal measuring step for measuring a predetermined parameter concerning a reflected signal for the input signal; a signal output acquiring step for acquiring the predetermined parameter concerning the input signal after the occurrence of the measurement system error factors; and a measurement system error factor acquiring step for acquiring the measurement system error factors based on the measurement results of the input signal measuring step, the reflected signal measuring step and the signal output acquiring step.

The present invention as previously described is a network analyzing method wherein a network analyzing is performed by a network analyzer having a receiving element for receiving the input signal, after being output, as a received signal, the method further including a received signal measuring step for measuring a predetermined parameter concerning the received signal, wherein the measurement system error factor acquiring step acquires measurement system error factors based on the measurement results of the input signal measuring step, the reflected signal measuring step, the signal output acquiring step and the received signal measuring step.

The present invention as previously described is a network analyzing method wherein the reflected signal measuring step measures a predetermined parameter concerning a reflected signal for the input signal reflected from a device under test, and wherein the receiving element receives the input signal, after being output, through the device under test as the received signal, the method further including a parameter measuring element for measuring predetermined parameters concerning the device under test based on the measurement results, concerning the device under test, of the input signal measuring element, the reflected signal measuring step and the received signal measuring step, and the measurement system error factors.

The present invention as previously described is a network analyzer-method that further includes: a receiving side input signal measuring step for measuring a predetermined parameter concerning the input signal before the occurrence of measurement system error factors; a receiving side reflected signal measuring step for measuring a predetermined parameter concerning a receiving side reflected signal for the input signal after being output from the receiving element and being reflected; a receiving side signal output acquiring step for acquiring the predetermined parameter concerning the input signal after the occurrence of the measurement system error factors; and a receiving side measurement system error factor acquiring step for acquiring the measurement system error factors based on the measurement results of the receiving side input signal measuring step, the receiving side reflected signal measuring step and the receiving side signal output acquiring step.

The present invention as previously described is a network analyzer method wherein the reflected signal measuring step measures a predetermined parameter by receiving the input signal after being output from the receiving element, and wherein the receiving side measurement system error factor acquiring step acquires measurement system error factors based on the measurement results of the receiving side input signal measuring step, the receiving side reflected signal measuring step, the receiving side signal output acquiring step and the reflected signal measuring step.

The present invention as previously described is a network analyzer method wherein in the case the input signal is given to a device under test directly, the reflected signal measuring step measures a predetermined parameter concerning a reflected signal for the input signal reflected from the device under test and the receiving element receives the input signal, after being output, through the device under test as the received signal, and wherein in the case the input signal is given to the device under test through the receiving element, the receiving side reflected signal measuring step measures a predetermined parameter concerning a receiving side reflected signal for the input signal reflected from the device under test and the reflected signal measuring step measures a predetermined parameter by receiving the input signal, after being output from the receiving element, through the device under test, the method further including: a parameter measuring step for measuring predetermined parameters concerning the device under test based on: the measurement results, concerning the device under test, of the input signal measuring step, the reflected signal measuring step and the received signal measuring step in the case the input signal is given to the device under test directly; the measurement results, concerning the device under test, of the receiving side input signal measuring step, the receiving side reflected signal measuring step and the reflected signal measuring step in the case the input signal is given to the device under test through the receiving element; and the measurement system error factors.

The present invention as described is a program of instructions for execution by the computer to perform a network analyzing process of a network analyzer having: an input signal measuring element for measuring a predetermined parameter concerning an input signal before the occurrence of measurement system error factors; a reflected signal measuring element for measuring a predetermined parameter concerning a reflected signal for the input signal; and a signal output acquiring element for acquiring the predetermined parameter concerning the input signal after the occurrence of the measurement system error factors, the network analyzing process including: a measurement system error factor acquiring step for acquiring the measurement system error factors based on the measurement results of the input signal measuring element, the reflected signal measuring element and the signal output acquiring element.

The present invention as previously described is a program wherein the network analyzer further including a receiving element for receiving the input signal, after being output, as a received signal, the receiving element having a received signal measuring element for measuring a predetermined parameter concerning the received signal, and wherein the measurement system error factor acquiring step acquires measurement system error factors based on the measurement results of the input signal measuring element, the reflected signal measuring element, the signal output acquiring element and the received signal measuring element.

The present invention as previously described is a program wherein the reflected signal measuring element measures a predetermined parameter concerning a reflected signal for the input signal reflected from a device under test, and wherein the receiving element receives the input signal, after being output, through the device under test as the received signal, the network analyzing process further including a parameter measuring step for measuring predetermined parameters concerning the device under test based on the measurement results, concerning the device under test, of the input signal measuring element, the reflected signal measuring element and the received signal measuring element, and the measurement system error factors.

The present invention as previously described is a program wherein the receiving element includes: a receiving side input signal measuring element for measuring a predetermined parameter concerning the input signal before the occurrence of measurement system error factors; a receiving side reflected signal measuring element for measuring a predetermined parameter concerning a receiving side reflected signal for the input signal after being output from the receiving element and being reflected; and a receiving side signal output acquiring element for acquiring the predetermined parameter concerning the input signal after the occurrence of the measurement system error factors, the network analyzing process further including a receiving side measurement system error factor acquiring step for acquiring the measurement system error factors based on the measurement results of the receiving side input signal measuring element, the receiving side reflected signal measuring element and the receiving side signal output acquiring element.

The present invention as previously described is a program wherein the reflected signal measuring element measures a predetermined parameter by receiving the input signal after being output from the receiving element, and wherein the receiving side measurement system error factor acquiring step acquires measurement system error factors based on the measurement results of the receiving side input signal measuring element, the receiving side reflected signal measuring element, the receiving side signal output acquiring element and the reflected signal measuring element.

The present invention as previously described is a program wherein in the case the input signal is given to a device under test directly, the reflected signal measuring element measures a predetermined parameter concerning a reflected signal for the input signal reflected from the device under test and the receiving element receives the input signal, after being output, through the device under test as the received signal, and wherein in the case the input signal is given to the device under test through the receiving element, the receiving side reflected signal measuring element measures a predetermined parameter concerning a receiving side reflected signal for the input signal reflected from the device under test and the reflected signal measuring element measures a predetermined parameter by receiving the input signal, after being output from the receiving element, through the device under test, the network analyzing process further including a parameter measuring step for measuring predetermined parameters concerning the device under test based on: the measurement results, concerning the device under test, of the input signal measuring element, the reflected signal measuring element and the received signal measuring element in the case the input signal is given to the device under test directly; the measurement results, concerning the device under test, of the receiving side input signal measuring element, the receiving side reflected signal measuring element and the reflected signal measuring element in the case the input signal is given to the device under test through the receiving element; and the measurement system error factors.

The present invention as described is a computer-readable medium having a program of instructions for execution by the computer to perform a network analyzing process of a network analyzer having: an input signal measuring element for measuring a predetermined parameter concerning an input signal before the occurrence of measurement system error factors; a reflected signal measuring element for measuring a predetermined parameter concerning a reflected signal for the input signal; and a signal output acquiring element for acquiring the predetermined parameter concerning the input signal after the occurrence of the measurement system error factors, the network analyzing process including: a measurement system error factor acquiring step for acquiring the measurement system error factors based on the measurement results of the input signal measuring element, the reflected signal measuring element and the signal output acquiring element.

The present invention as previously described is a computer-readable medium having a program wherein the network analyzer further including a receiving element for receiving the input signal, after being output, as a received signal, the receiving element having a received signal measuring element for measuring a predetermined parameter concerning the received signal, and wherein the measurement system error factor acquiring step acquires measurement system error factors based on the measurement results of the input signal measuring element, the reflected signal measuring element, the signal output acquiring element and the received signal measuring element.

The present invention as previously described is a computer-readable medium having a program wherein the reflected signal measuring element measures a predetermined parameter concerning a reflected signal for the input signal reflected from a device under test, and wherein the receiving element receives the input signal, after being output, through the device under test as the received signal, the network analyzing process further including a parameter measuring step for measuring predetermined parameters concerning the device under test based on the measurement results, concerning the device under test, of the input signal measuring element, the reflected signal measuring element and the received signal measuring element, and the measurement system error factors.

The present invention as previously described is a computer-readable medium having a program wherein the receiving element includes: a receiving side input signal measuring element for measuring a predetermined parameter concerning the input signal before the occurrence of measurement system error factors; a receiving side reflected signal measuring element for measuring a predetermined parameter concerning a receiving side reflected signal for the input signal after being output from the receiving element and being reflected; and a receiving side signal output acquiring element for acquiring the predetermined parameter concerning the input signal after the occurrence of the measurement system error factors, the network analyzing process further including a receiving side measurement system error factor acquiring step for acquiring the measurement system error factors based on the measurement results of the receiving side input signal measuring element, the receiving side reflected signal measuring element and the receiving side signal output acquiring element.

The present invention as previously described is a computer-readable medium having a program wherein the reflected signal measuring element measures a predetermined parameter by receiving the input signal after being output from the receiving element, and wherein the receiving side measurement system error factor acquiring step acquires measurement system error factors based on the measurement results of the receiving side input signal measuring element, the receiving side reflected signal measuring element, the receiving side signal output acquiring element and the reflected signal measuring element.

The present invention as previously described is a computer-readable medium having a program wherein in the case the input signal is given to a device under test directly, the reflected signal measuring element measures a predetermined parameter concerning a reflected signal for the input signal reflected from the device under test and the receiving element receives the input signal, after being output, through the device under test as the received signal, and wherein in the case the input signal is given to the device under test through the receiving element, the receiving side reflected signal measuring element measures a predetermined parameter concerning a receiving side reflected signal for the input signal reflected from the device under test and the reflected signal measuring element measures a predetermined parameter by receiving the input signal, after being output from the receiving element, through the device under test, the network analyzing process further including a parameter measuring step for measuring predetermined parameters concerning the device under test based on: the measurement results, concerning the device under test, of the input signal measuring element, the reflected signal measuring element and the received signal measuring element in the case the input signal is given to the device under test directly; the measurement results, concerning the device under test, of the receiving side input signal measuring element, the receiving side reflected signal measuring element and the reflected signal measuring element in the case the input signal is given to the device under test through the receiving element; and the measurement system error factors.

The present invention as described is an automatic corrector being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, the automatic corrector including: a plurality of correction tools for achieving different conditions respectively and an input signal providing element for providing the input signal by selecting any one of the correction tools or the receiving element automatically.

The present invention as previously described is an automatic corrector wherein the input signal providing element provides the input signal by selecting any one of the correction tools, the receiving element, or the signal output acquiring element automatically.

The present invention as previously described is an automatic corrector wherein the input signal providing element provides the input signal to the signal output acquiring element through a power meter.

The present invention as previously described is an automatic corrector wherein the input signal providing element provides the input signal to the signal output acquiring element through a power sensor and a power meter body, the power sensor being built in the automatic corrector and the power meter body being built in the network analyzer.

The present invention as described is an automatic corrector being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, wherein the receiving element includes: (e-1) a receiving side input signal measuring element for measuring a predetermined parameter concerning the input signal before the occurrence of measurement system error factors; (e-2) a receiving side reflected signal measuring element for measuring a predetermined parameter concerning a receiving side reflected signal for the input signal after being output from the receiving element and being reflected; (e-3) a receiving side signal output acquiring element for acquiring the predetermined parameter concerning the input signal after the occurrence of the measurement system error factors; and (e-4) a receiving side measurement system error factor acquiring element for acquiring the measurement system error factors based on the measurement results of the receiving side input signal measuring element, the receiving side reflected signal measuring element and the receiving side signal output acquiring element, the automatic corrector including: a plurality of first correction tools for achieving different conditions respectively in regard to the signal source of the input signal; a plurality of second correction tools for achieving different conditions respectively in regard to the receiving element; a first input signal providing element for providing the input signal from the signal source by selecting any one of the first correction tools or the receiving element automatically; and a second input signal providing element for providing the input signal routed through the receiving element by selecting any one of the second correction tools or the signal source automatically.

The present invention as previously described is an automatic corrector wherein the first input signal providing element provides the input signal by selecting any one of the first correction tools, the receiving element, or the signal output acquiring element automatically, and wherein the second input signal providing element provides the input signal routed through the receiving element by selecting any one of the second correction tools, the signal source, or the receiving side signal output acquiring element automatically.

The present invention as previously described is an automatic corrector wherein the first input signal providing element provides the input signal to the signal output acquiring element through a first power meter, while the second input signal providing element provides the input signal to the receiving side signal output acquiring element through a second power meter.

The present invention as previously described is an automatic corrector wherein the first input signal providing element provides the input signal to the signal output acquiring element through a first power sensor and a first power meter body, while the second input signal providing element provides the input signal to the receiving side signal output acquiring element through a second power sensor and a second power meter body, the first and second power sensors being built in the automatic corrector and the first and second power meter bodies being built in the network analyzer.

The present invention as described is a correction method of an automatic corrector having a plurality of correction tools for achieving different conditions respectively and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, the correction method including an input signal providing step for providing the input signal by selecting any one of the correction tools or the receiving element automatically.

The present invention as described is a correction method of an automatic corrector having a plurality of first correction tools for achieving different conditions respectively in regard to the signal source of the input signal, and a plurality of second correction tools for achieving different conditions respectively in regard to the receiving element; and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, wherein the receiving element includes: (e-1) a receiving side input signal measuring element for measuring a predetermined parameter concerning the input signal before the occurrence of measurement system error factors; (e-2) a receiving side reflected signal measuring element for measuring a predetermined parameter concerning a receiving side reflected signal for the input signal after being output from the receiving element and being reflected; (e-3) a receiving side signal output acquiring element for acquiring the predetermined parameter concerning the input signal after the occurrence of the measurement system error factors; and (e-4) a receiving side measurement system error factor acquiring element for acquiring the measurement system error factors based on the measurement results of the receiving side input signal measuring element, the receiving side reflected signal measuring element and the receiving side signal output acquiring element, the correction method including: a first input signal providing step for providing the input signal from the signal source by selecting any one of the first correction tools or the receiving element automatically; and a second input signal providing step for providing the input signal routed through the receiving element by selecting any one of the second correction tools or the signal source automatically.

The present invention as described is a program of instructions for execution by the computer to perform a correction process of an automatic corrector having a plurality of correction tools for achieving different conditions respectively and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, the correction process including an input signal providing step for providing the input signal by selecting any one of the correction tools or the receiving element automatically.

The present invention as described is a program of instructions for execution by the computer to perform a correction process of an automatic corrector having a plurality of first correction tools for achieving different conditions respectively in regard to the signal source of the input signal, and a plurality of second correction tools for achieving different conditions respectively in regard to the receiving element; and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, wherein the receiving element includes: (e-1) a receiving side input signal measuring element for measuring a predetermined parameter concerning the input signal before the occurrence of measurement system error factors; (e-2) a receiving side reflected signal measuring element for measuring a predetermined parameter concerning a receiving side reflected signal for the input signal after being output from the receiving element and being reflected; (e-3) a receiving side signal output acquiring element for acquiring the predetermined parameter concerning the input signal after the occurrence of the measurement system error factors; and (e-4) a receiving side measurement system error factor acquiring element for acquiring the measurement system error factors based on the measurement results of the receiving side input signal measuring element, the receiving side reflected signal measuring element and the receiving side signal output acquiring element, the correction process including: a first input signal providing step for providing the input signal from the signal source by selecting any one of the first correction tools or the receiving element automatically; and a second input signal providing step for providing the input signal routed through the receiving element by selecting any one of the second correction tools or the signal source automatically.

The present invention as described is a computer-readable medium having a program of instructions for execution by the computer to perform a correction process of an automatic corrector having a plurality of correction tools for achieving different conditions respectively and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, the correction process including an input signal providing step for providing the input signal by selecting any one of the correction tools or the receiving element automatically.

The present invention as described is a computer-readable medium having a program of instructions for execution by the computer to perform a correction process of an automatic corrector having a plurality of first correction tools for achieving different conditions respectively in regard to the signal source of the input signal, and a plurality of second correction tools for achieving different conditions respectively in regard to the receiving element; and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for the input signal; (c) a signal output acquiring element for acquiring the predetermined parameter concerning the input signal after the occurrence of the measurement system error factors; (d) a measurement system error factor acquiring element for acquiring the measurement system error factors based on the measurement results of the input signal measuring element, the reflected signal measuring element and the signal output acquiring element, and (e) a receiving element for receiving the input signal, after being output, as a received signal, wherein the receiving element includes: (e-1) a receiving side input signal measuring element for measuring a predetermined parameter concerning the input signal before the occurrence of measurement system error factors; (e-2) a receiving side reflected signal measuring element for measuring a predetermined parameter concerning a receiving side reflected signal for the input signal after being output from the receiving element and being reflected; (e-3) a receiving side signal output acquiring element for acquiring the predetermined parameter concerning the input signal after the occurrence of the measurement system error factors; and (e-4) a receiving side measurement system error factor acquiring element for acquiring the measurement system error factors based on the measurement results of the receiving side input signal measuring element, the receiving side reflected signal measuring element and the receiving side signal output acquiring element, the correction process including: a first input signal providing step for providing the input signal from the signal source by selecting any one of the first correction tools or the receiving element automatically; and a second input signal providing step for providing the input signal routed through the receiving element by selecting any one of the second correction tools or the signal source automatically.

BEST MODE FOR CARRYING OUT THE INVENTION

Embodiments of the present invention will hereinafter be described with reference to the accompanying drawings.

(a) First Embodiment

Figure 1:
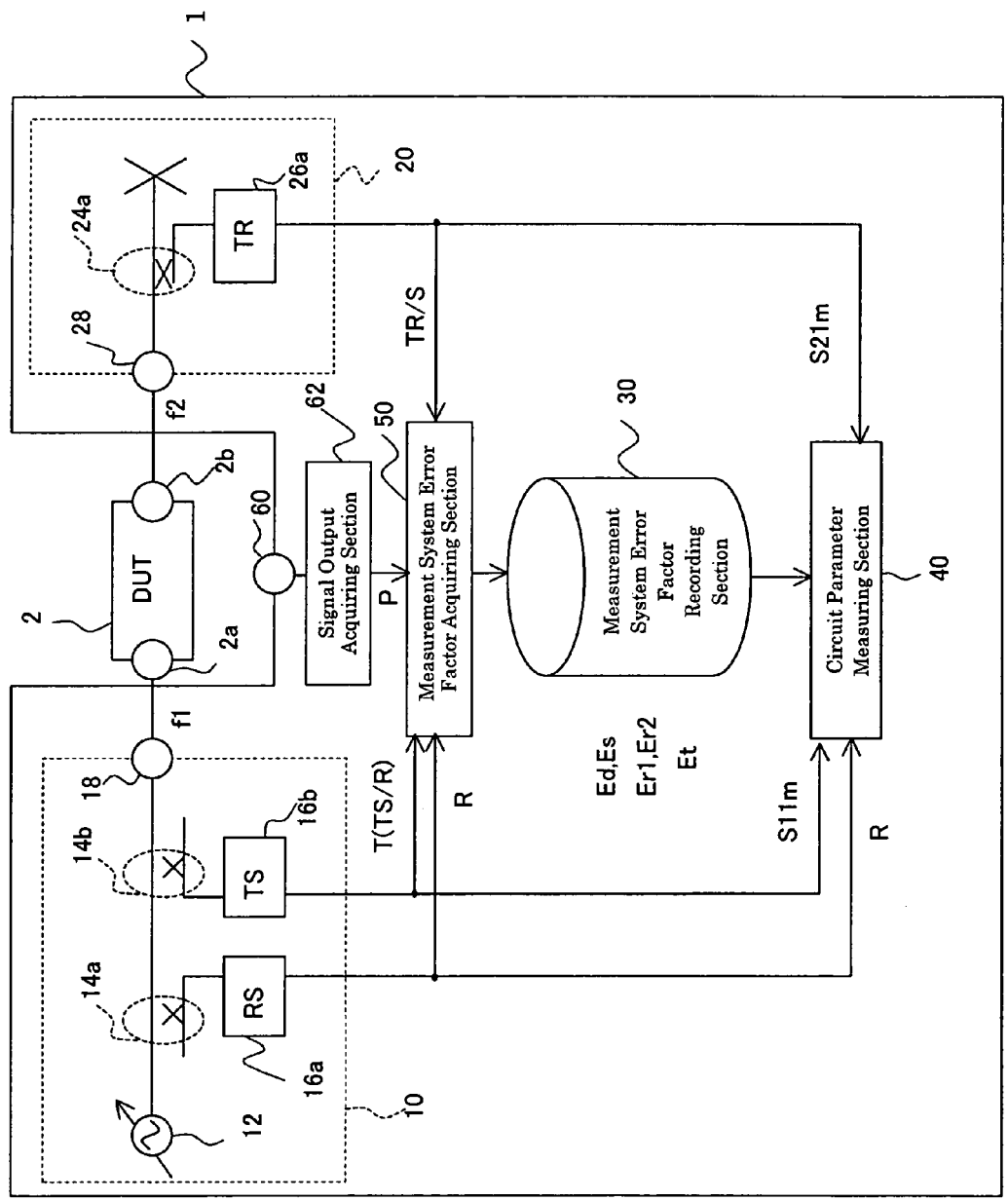
FIG. 1 is a block diagram showing the configuration of a network analyzer 1 according to a first embodiment.

FIG. 1 is a block diagram showing the configuration of a network analyzer 1 according to the first embodiment. A DUT (Device Under Test) 2 is connected to the network analyzer 1. The network analyzer 1 measures circuit parameters, e.g. S parameters, of the DUT 2. The DUT 2 has an input terminal 2a and an output terminal 2b. There may be a difference between the signal frequency f1 at the input terminal 2a and the signal frequency f2 at the output terminal 2b. For example, if the DUT 2 is a one having frequency conversion functions (mixer for example), f1≠f2 becomes true.

The network analyzer 1 comprises a signal source 10, a receiving element 20, a measurement system error factor recording section 30, a circuit parameter measuring section 40, a measurement system error factor acquiring section 50, a terminal 60 for power meter, and a signal output acquiring section 62.

The signal source 10 provides signal to the DUT 2. The signal source 10 has a signal outputting section 12, bridges 14a and 14b, a receiver (RS) 16a (input signal measuring element), a receiver (TS) 16b (reflected signal measuring element), and an output terminal 18.

The signal outputting section 12 outputs an input signal of a predetermined frequency f1. It is noted that the predetermined frequency can be changed.

The bridge 14a provides the signal output from the signal outputting section 12 to the receiver (RS) 16a. The signal provided by the bridge 14a can be considered one not affected by measurement system error factors due to the signal source 10. The bridge 14b provides a reflected signal, which is output from the output terminal 18 as the input signal and then returned back reflectively, to the receiver (TS) 16b. It is noted that the bridges 14a and 14b may be power splitters. Other bridges to be described hereinafter can also be replaced by power splitters.

The receiver (RS) 16a (input signal measuring element) measures the S parameter of the signal received through the bridge 14a. Therefore, the receiver (RS) 16a measures the S parameter concerning the input signal before the occurrence of the effect of the measurement system error factors due to the signal source 10.

The receiver (TS) 16b (reflected signal measuring element) measures the S parameter of the signal received through the bridge 14b. Therefore, the receiver (TS) 16b measures the S parameter concerning a reflected signal.

The output terminal 18 is for outputting the input signal.

The receiving element 20 receives the input signal after being output from the output terminal 18 as a received signal. In an example shown in FIG. 1, the input signal is received through the DUT 2 as a received signal. The receiving element 20 has a bridge 24a, a receiver (TR) 26a, and an input terminal 28.

The bridge 24a provides the signal input from the input terminal 28 to the receiver (TR) 26a. The receiver (TR) 26a (received signal measuring element) measures the S parameter of the received signal. The input terminal 28 is for receiving signal by the receiving element 20. In such a case as shown in FIG. 1, the input terminal 28 receives the input signal through the DUT 2.

Figure 2:
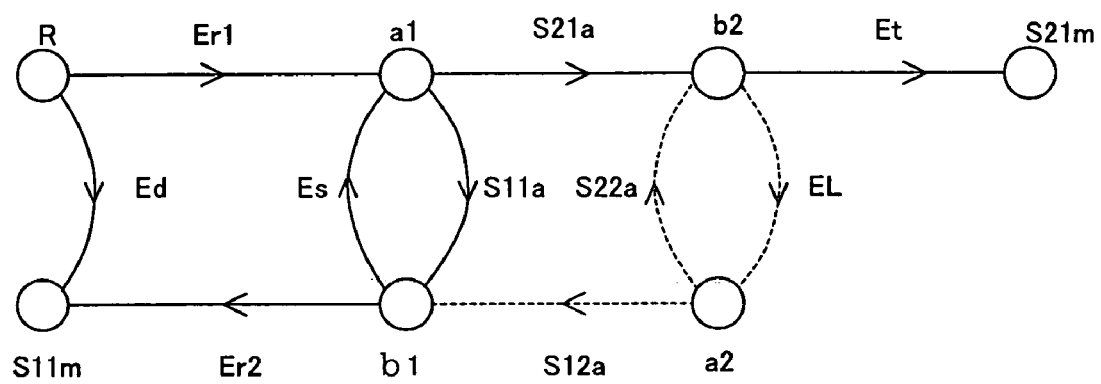
FIG. 2 is a view depicting, with a signal flow graph, the state shown in FIG. 1.

The measurement system error factor recording section 30 records the measurement system error factors of the network analyzer 1. The measurement system error factors include Ed (error due to the directionality of the bridges), Er1 and Er2 (errors due to frequency tracking), Es (error due to source matching), and Et. FIG. 2 shows a representation of the state shown in FIG. 1 with a signal flow graph. S11a, S21a, S12a and S22a are the true S parameters (without any effect of the measurement system error factors) of the DUT 2, and EL is a further measurement system error factor. However, S12a, S22a and EL are ignored in the first embodiment.

The circuit parameter measuring section 40 measures the true S parameters (S11a and S21a) (without any effect of the measurement system error factors) of the DUT 2 based on the measurement data (S parameters), concerning the DUT 2, of the receiver (RS) 16a (input signal measuring element), the receiver (TS) 16b (reflected signal measuring element), and the receiver (TR) 26a (received signal measuring element), and the measurement system error factors recorded in the measurement system error factor recording section 30. Here, the measurement data, concerning the DUT 2, of the receiver (RS) 16a (input signal measuring element), the receiver (TS) 16b (reflected signal measuring element), and the receiver (TR) 26a (received signal measuring element) are indicated, respectively, by R, S11m and S21m (refer to FIG. 2).

It is noted that the measurement data, concerning the DUT 2, of the receiver (RS) 16a, etc. means that measured by the receiver (RS) 16a, etc. when the DUT 2 is connected to the network analyzer 1.

The measurement data, concerning the DUT 2, of the receiver (RS) 16a is that measured by the receiver (RS) 16a when the DUT 2 is connected to the network analyzer 1. The measurement data, concerning the DUT 2, of the receiver (TS) 16b is that obtained by measuring a reflected signal for the input signal reflected from the DUT 2 using the receiver (TS) 16b when the DUT 2 is connected to the network analyzer 1. Also, the receiving element 20 receives the input signal, after being output from the output terminal 18, through the DUT 2 as a received signal. Measurement data, concerning the received signal, by the receiver (TR) 26a is the measurement data, concerning the DUT 2, of the receiver (TR) 26a.

The circuit parameter measuring section 40 measures S11a and S21a in accordance with the following mathematical expressions:

$$S11a = \frac{Er1Er2 \cdot R}{S11m - Ed \cdot R + EsEr1Er2 \cdot R} \quad \text{[Equation 1]}$$

$$S21a = \left(1 - \frac{EsEr1Er2 \cdot R}{S11m - Ed \cdot R + EsEr1Er2 \cdot R}\right) \frac{S21m}{Er1Et \cdot R}$$

The measurement system error factor acquiring section 50 acquires the measurement system error factors (Ed, Er1, Er2, Es and Et) based on the measurement results of the receiver (RS) 16a (input signal measuring element), the receiver (TS) 16b (reflected signal measuring element), the receiver (TR) 26a (received signal measuring element), and the signal output acquiring section 62. Upon the acquisition of the measurement system error factors, a correction tool 4, a power meter 6, and the receiving element 20 are connected to the signal source 10 in sequence.

Figure 3:
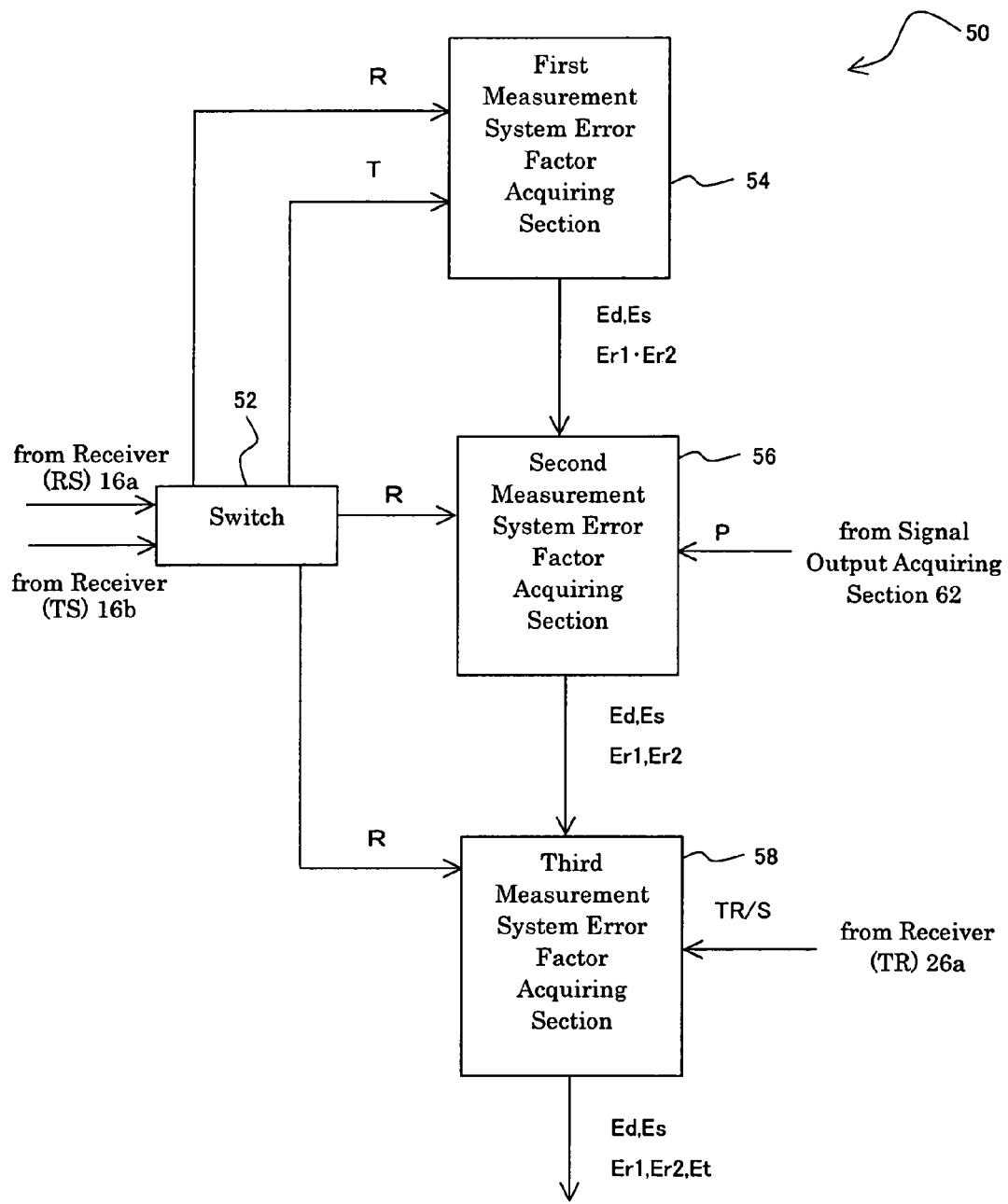
FIG. 3 is a block diagram showing the configuration of a measurement system error factor acquiring section 50.

In FIG. 3 is shown the configuration of the measurement system error factor acquiring section 50. The measurement system error factor acquiring section 50 has a switch 52, a first measurement system error factor acquiring section 54, a second measurement system error factor acquiring section 56, and a third measurement system error factor acquiring section 58.

The switch 52 receives measurement data (S parameters for example) from the receiver (RS) 16a (input signal measuring element) and the receiver (TS) 16b (reflected signal measuring element), and then outputs these signals to any one of the first measurement system error factor acquiring section 54, the second measurement system error factor acquiring section 56, or the third measurement system error factor acquiring section 58, in accordance with the type of an article connected to the signal source 10.

That is, the switch 52 outputs the measurement data (S parameters for example) received from the receiver (RS) 16a and the receiver (TS) 16b to the first measurement system error factor acquiring section 54, the second measurement system error factor acquiring section 56, or the third measurement system error factor acquiring section 58, respectively, when the correction tool 4, the power meter 6, or the receiving element 20 is connected to the signal source 10. The measurement data received from the receiver (TS) 16b, however, may not be output to the second measurement system error factor acquiring section 56 and the third measurement system error factor acquiring section 58.

Figure 4:
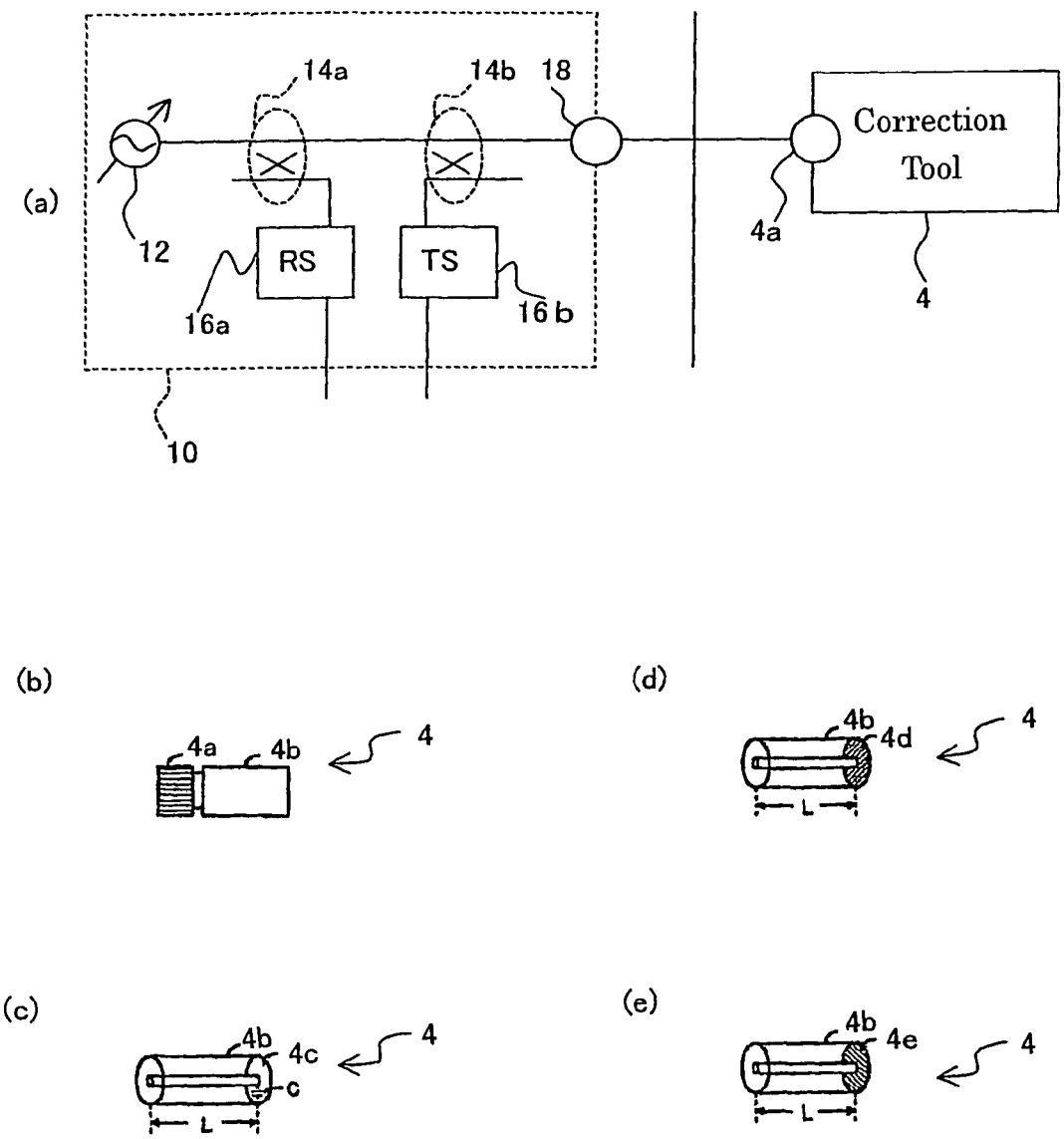
FIG. 4 includes a block diagram (FIG. 4(*a*)) showing the state where a correction tool 4 is connected to a signal source 10 and views (FIGS. 4(*b*) to 4(*e*)) showing the appearance of the respective correction tool 4.

The first measurement system error factor acquiring section 54 receives the measurement data of the receiver (RS) 16a and the receiver (TS) 16b, when the correction tool 4 is connected to the signal source 10, and then acquires Ed, Es and Er1·Er2 (product of Er1 and Er2). In FIG. 4(a) is shown the state where the correction tool 4 is connected to the signal source 10. A terminal 4a of the correction tool 4 and the output terminal 18 of the signal source 10 are connected to each other. It is noted that components other than the signal source 10 of the network analyzer 1 are omitted in FIG. 4(a). The correction tool 4 is a known one that achieves three kinds of conditions of opening, shorting and loading (standard loading Z0) as described in Japanese Patent Laid-Open Publication No. Hei. 11-038054.

The correction tool 4, the appearance of which is shown in FIG. 4(b), has a connector 4a and a body 4b. FIG. 4(c) shows an open element, where a terminal 4c is opened, having a stray capacitance C. FIG. 4(d) shows a short element, where a terminal 4d is short-circuited. FIG. 4(e) shows a load element, where a terminal 4e is terminated with a standard loading (impedance) Z0.

Figure 5:
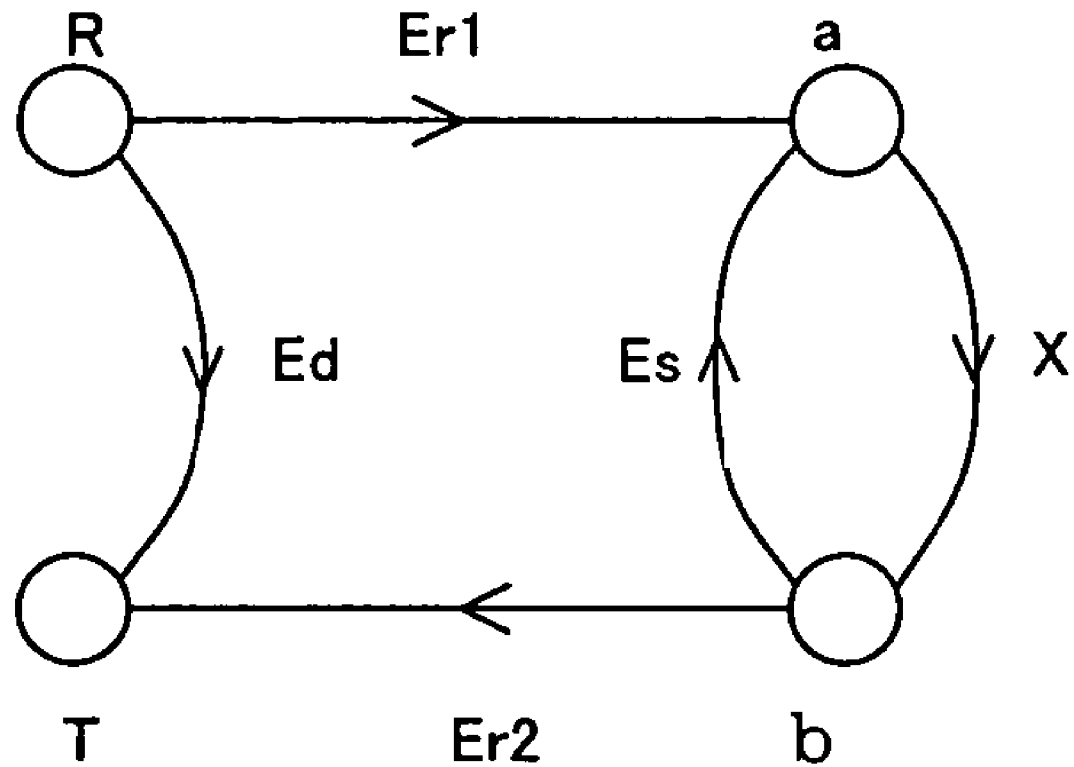
FIG. 5 is a view depicting, with a signal flow graph, the state where the correction tool 4 is connected to the signal source 10.

In FIG. 5 is shown, with a signal flow graph, the state where the correction tool 4 is connected to the signal source 10. Here, the measurement data of the receiver (RS) 16a and the receiver (TS) 16b are indicated, respectively, by R and T. The relationship between R and T is as shown in the following mathematical expression:

$$\frac{T}{R} = Ed + \frac{Er1Er2 \cdot X}{1 - EsX} \quad \text{[Equation 2]}$$

Here, since three kinds of the correction tools 4 are to be connected, three kinds of relationships between R and T can be obtained. Consequently, three kinds of variables of Ed, Es and Er1·Er2 can also be obtained.

The second measurement system error factor acquiring section 56 receives measurement data of the receiver (RS) 16a, Ed, Es and Er1·Er2 (measurement system error factors acquired by the first measurement system error factor acquiring section 54), and an output (power P) of the signal output acquiring section 62, when the power meter 6 is connected to the signal source 10 and to the terminal 60 for power meter, and then acquires Er1 and Er2.

Figure 6:
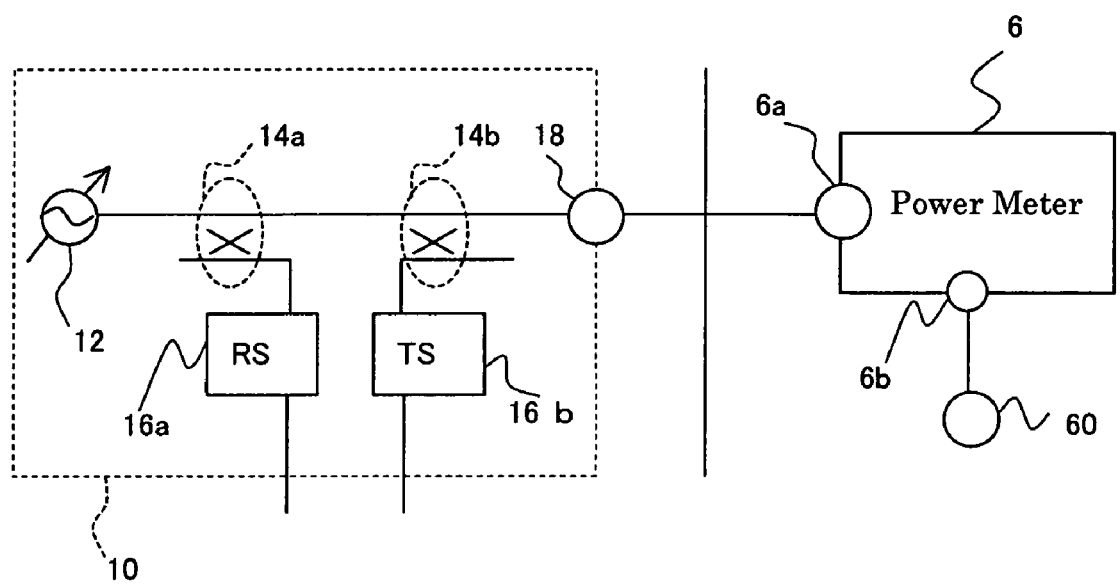
FIG. 6 is a view showing the state where a power meter 6 is connected to the signal source 10 and to a terminal 60 for power meter.

In FIG. 6 is shown the state where the power meter 6 is connected to the signal source 10 and to the terminal 60 for power meter. It is noted that components other than the signal source 10 and the terminal 60 for power meter of the network analyzer 1 are omitted in FIG. 6. A terminal 6a of the power meter 6 is connected to the output terminal 18 of the signal source 10. A terminal 6b of the power meter 6 is connected to the terminal 60 for power meter. The power meter 6 measures the power of signal received through the terminal 6a. The signal output acquiring section 62 acquires the power P through the terminal 60 for power meter and the terminal 6b, and then outputs to the second measurement system error factor acquiring section 56.

Figure 7:
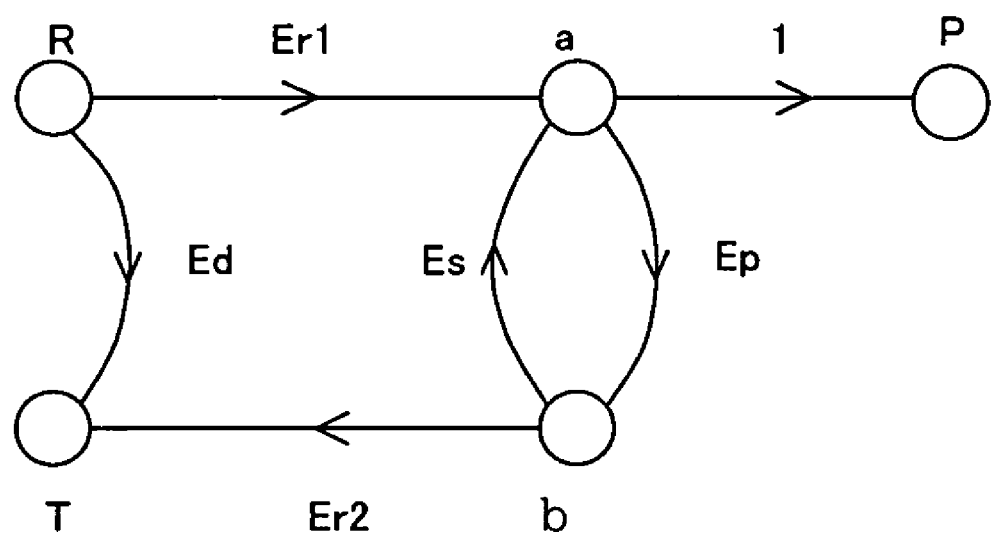
FIG. 7 is a view depicting, with a signal flow graph, the state where the power meter 6 is connected to the signal source 10 and to the terminal 60 for power meter.

In FIG. 7 is shown, with a signal flow graph, the state where the power meter 6 is connected to the signal source 10 and to the terminal 60 for power meter. Here, the measurement data of the receiver (RS) 16a and the power meter 6 are indicated, respectively, by R and P. As is clear from FIG. 7, P is a parameter concerning the input signal and is acquired after the occurrence of the measurement system error factors. The relationship between R and P is as shown in the following mathematical expression:

$$\frac{P}{R} = \frac{Er}{1 - EsEp} \quad \text{[Equation 3]}$$

Here, since Es is given and Ep is measurable, Er1 can be obtained. Er1·Er2 is given, which also makes it possible to obtain Er2. Thus, Er1 and Er2, which flow in opposite directions to each other in the signal flow graph (refer to FIG. 7), can be obtained from Er1·Er2. That is, Er1 and Er2, which being integrated in Er1·Er2, can be separated from each other.

The first measurement system error factor acquiring section 54 receives the measurement data of the receiver (RS) 16a (input signal measuring element) and the receiver (TS) 16b (reflected signal measuring element), and then acquires Ed, Es, Er1·Er2. The second measurement system error factor acquiring section 56 receives the measurement data of the receiver (RS) 16a (input signal measuring element) and the signal output acquiring section 62, and then acquires Er1 and Er2. Therefore, the first measurement system error factor acquiring section 54 and the second measurement system error factor acquiring section 56 acquire the measurement system error factors (Ed, Es, Er1 and Er2) based on the measurement data of the receiver (RS) 16a (input signal measuring element), the receiver (TS) 16b (reflected signal measuring element), and the signal output acquiring section 62.

The third measurement system error factor acquiring section 58 receives measurement data of the receiver (RS) 16a, Ed, Es, Er1 and Er2 (measurement system error factors acquired by the second measurement system error factor acquiring section 56), and measurement data of the receiver (TR) 26a, when the receiving element 20 is connected to the signal source 10, and then acquires Et.

Figure 8:
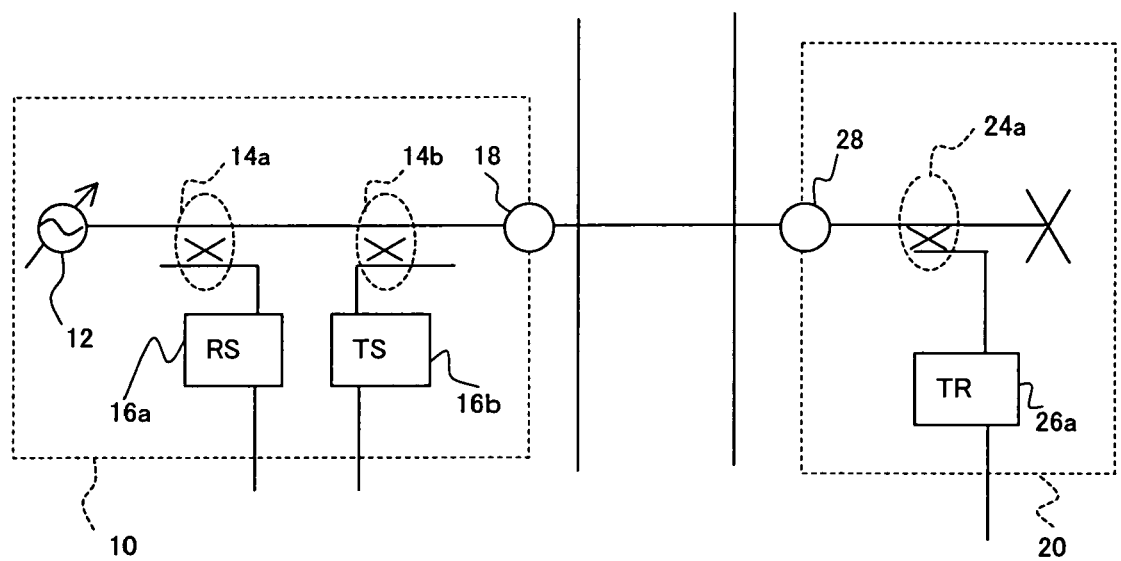
FIG. 8 is a view showing the state where a receiving means 20 is connected to the signal source 10.

In FIG. 8 is shown the state where the receiving element 20 is connected to the signal source 10. The output terminal 18 of the signal source 10 and the input terminal 28 of the receiving element 20 are connected to each other. It is noted that components other than the signal source 10 and the receiving element 20 of the network analyzer 1 are omitted in FIG. 8.

Figure 9:
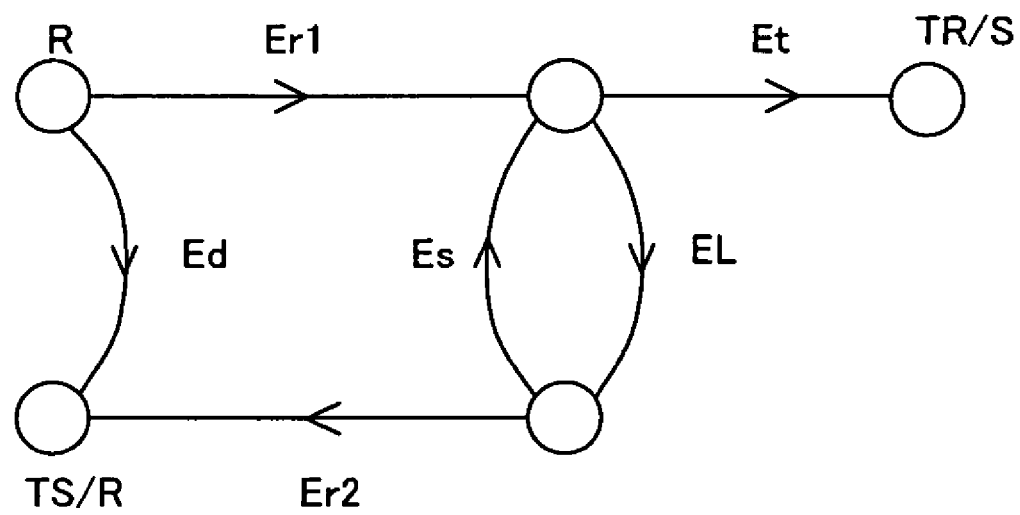
FIG. 9 is a view depicting, with a signal flow graph, the state where the receiving means 20 is connected to the signal source 10.

In FIG. 9 is shown, with a signal flow graph, the state where the receiving element 20 is connected to the signal source 10. Here, the measurement data of the receiver (RS) 16a and the receiver (TR) 26a (received signal measuring element) are indicated, respectively, by R and TR/S. The relationship between R and TR/S is as shown in the following mathematical expression:

$$\frac{TR/S}{R} = Er1Et \qquad \text{[Equation 4]}$$

Here, since Er1 is given, Et can be obtained. The third measurement system error factor acquiring section 58 outputs Ed, Es, Er1, Er2 and Et to the measurement system error factor recording section 30.

The terminal 60 for power meter is connected to the terminal 6b of the power meter 6. The signal output acquiring section 62 acquires the power P through the terminal 60 for power meter and the terminal 6b, and then outputs to the second measurement system error factor acquiring section 56.

Figure 10:
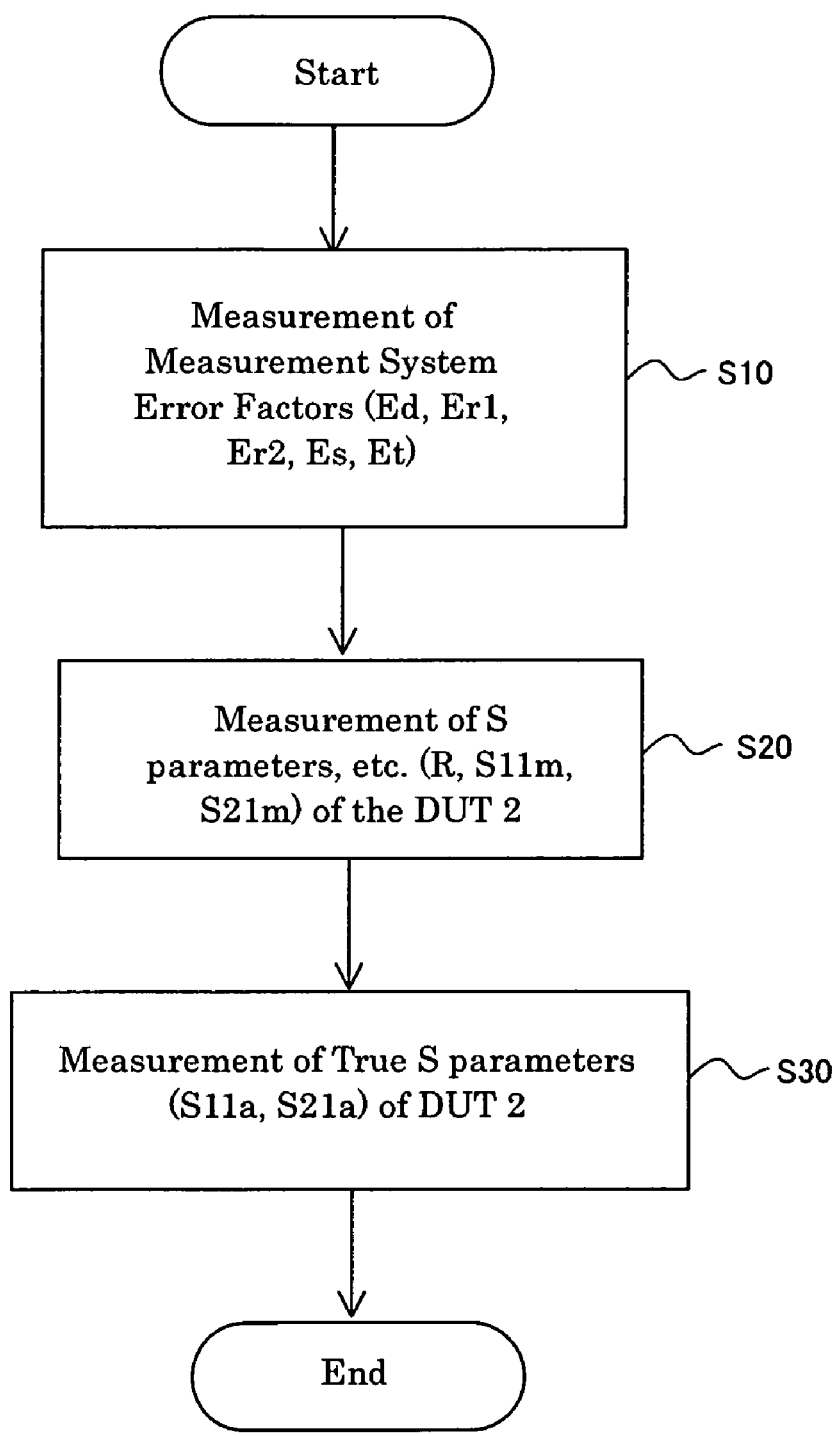
FIG. 10 is a flow chart showing the operation of the first embodiment.

Next, the operation of the first embodiment will be described. FIG. 10 is a flow chart showing the operation of the first embodiment.

Figure 11:
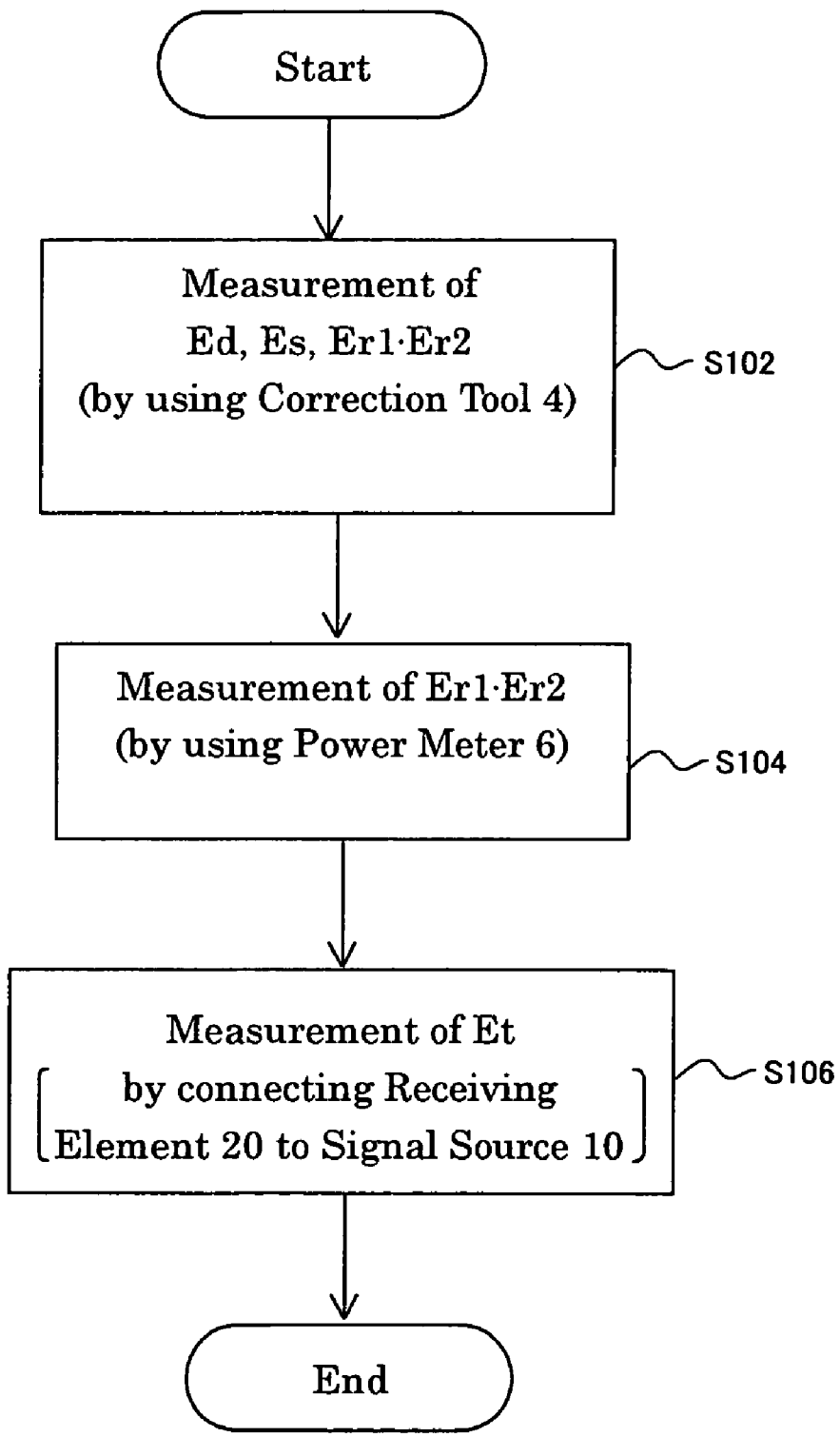
FIG. 11 is a flow chart showing the operation when measuring measurement system error factors.

First, the network analyzer 1 measures the measurement system error factors (Ed, Es, Er1, Er2 and Et) (S10). The measurement system error factors measured are recorded in the measurement system error factor recording section 30. The operation when measuring the measurement system error factors is explained with reference to the flow chart in FIG. 11.

First, three kinds of the correction tools 4 are connected to the signal source 10. The signal outputting section 12 outputs an input signal. The receiver (RS) 16a measures the input signal. The input signal is input to the correction tool 4 through the output terminal 18. Then, the receiver (TS) 16b measures a reflected signal from the correction tool 4. The first measurement system error factor acquiring section 54 receives the measurement data of the receiver (RS) 16a and the receiver (TS) 16b, and then acquires Ed, Es, Er1·Er2 (the product of Er1 and Er2) (S102).

Next, the power meter 6 is connected to the signal source 10 and to the terminal 60 for power meter. The signal outputting section 12 outputs an input signal. The receiver (RS) 16a measures the input signal. The input signal is input to the power meter 6 through the output terminal 18 and the terminal 6a. The power meter 6 measures the power P of the input signal. Then, the signal output acquiring section 62 acquires the power P through the terminal 60 for power meter and the terminal 6b, and then outputs to the second measurement system error factor acquiring section 56. The second measurement system error factor acquiring section 56 receives the measurement data of the receiver (RS) 16a, Ed, Es and Er1·Er2 (measurement system error factors acquired by the first measurement system error factor acquiring section 54), and the output (power P) of the signal output acquiring section 62, and then acquires Er1 and Er2 (S104).

Finally, the receiving element 20 is connected to the signal source 10. The signal outputting section 12 outputs an input signal. The receiver (RS) 16a measures the input signal. The input signal is received by the receiving element 20 through the output terminal 18 and the input terminal 28 as a received signal. The receiver (TR) 26a measures the received signal. Then, the third measurement system error factor acquiring section 58 receives the measurement data of the receiver (RS) 16a, Ed, Es, Er1 and Er2 (measurement system error factors acquired by the second measurement system error factor acquiring section 56), and the measurement data of the receiver (TR) 26a, and then acquires Et (S106).

Referring now back to FIG. 10, the DUT 2 is connected to the network analyzer 1 (refer to FIG. 1), and the S parameters, etc. (R, S11m and S21m) of the DUT 2 are measured (S20). That is, the signal outputting section 12 outputs an input signal. The receiver (RS) 16a measures the input signal. Data obtained in this measurement is found to be R. The input signal is input to the DUT 2 through the output terminal 18. Then, the receiver (TS) 16b measures a reflected signal from the DUT 2. Data obtained in this measurement is found to be S11m. The receiving element 20 receives the input signal, after being output from the output terminal 18, through the DUT 2 as a received signal. The receiver (TR) 26a measures the received signal. Data obtained in this measurement is found to be S21m. These data measured are sent to the circuit parameter measuring section 40.

Finally, the circuit parameter measuring section 40 measures the true S parameters (S11a and S21a) of the DUT 2 based on the S parameters, concerning the DUT 2, of the receiver (RS) 16a, the receiver (TS) 16b and the receiver (TR) 26a, and measurement system error factors recorded in the measurement system error factor recording section 30 (S30).

In accordance with the first embodiment, the signal output acquiring section 62 acquires the power P of an input signal after the occurrence of measurement system error factors. This allows errors Er1 and Er2, etc. due to frequency tracking to be separated depending on the direction thereof (in a signal flow graph). In the case where the frequency f1 of the input signal of the DUT 2 is different from the frequency f2 of the output signal thereof, errors Er1 and Er2, etc. due to frequency tracking vary depending on the direction thereof. Therefore, it is possible to correct measurement system errors by separating the measurement system error factors depending on the direction thereof.

Also, the receiver (TR) 26a measures the S parameter concerning a received signal, which makes it possible to acquire a measurement system error factor Et of the receiving element 20. In the case where the frequency f1 of the input signal of the DUT 2 is different from the frequency f2 of the output signal thereof, the measurement system error factor Et of the receiving element 20 cannot be ignored. Therefore, it is possible to correct measurement system errors by acquiring the measurement system error factor Et of the receiving element 20.

Thus, as the measurement system error factors Er1 and Er2 are separated depending on the direction thereof and further the measurement system error factor Et of the receiving element 20 is acquired, in combination with the measurement results, concerning the DUT 2, of the receiver (RS) 16a, the receiver (TS) 16b and the receiver (TR) 26a, it is possible to measure the S parameters concerning the DUT 2 while correcting errors.

(b) Second Embodiment

The second embodiment differs from the first embodiment in that the true S parameters of the DUT 2 (without any effect of the measurement system error factors) S12a and S22a, which are ignored in the first embodiment, are also made measurable.

Figure 12:
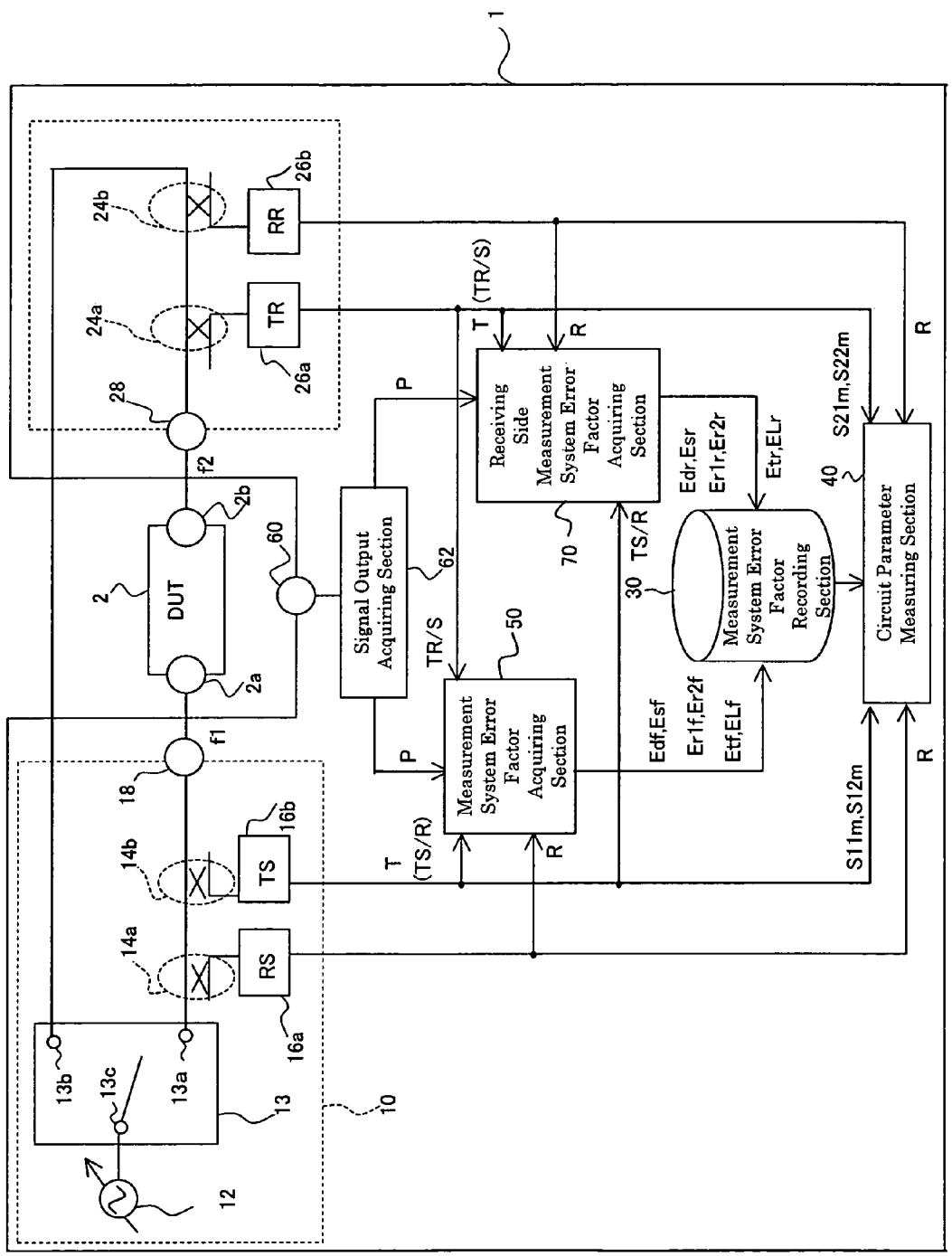
FIG. 12 is a block diagram showing the configuration of a network analyzer 1 according to a second embodiment.

FIG. 12 is a block diagram showing the configuration of a network analyzer 1 according to the second embodiment. The network analyzer 1 comprises a signal source 10, a receiving element 20, a measurement system error factor recording section 30, a circuit parameter measuring section 40, a measurement system error factor acquiring section 50, a terminal 60 for power meter a signal output acquiring section 62, and further a receiving side measurement system error factor acquiring section 70. Hereinafter, the same numerals are assigned to the same components in the first embodiment above to omit descriptions thereof.

The signal source 10 has a signal outputting section 12, a switch 13, bridges 14a and 14b, a receiver (RS) 16a (input signal measuring element), a receiver (TS) 16b (reflected signal measuring element), and an output terminal 18. The components other than the switch 13 are the same as in the first embodiment.

The switch 13 is for selecting whether an input signal output from the signal outputting section 12 is given to the DUT 2 directly or through the receiving element 20. The switch 13 has terminals 13a, 13b and 13c. The terminal 13a, 13b and 13c are connected respectively, to the output terminal 18, the receiving element 20 and the signal outputting section 12. When the terminals 13a and 13c are connected to each other, that is, the switch 13 is turned to the terminal 13a position, the input signal is to be given to the DUT 2 directly. In this case, the signal outputting section 12 outputs a signal with a frequency of f1. When the terminals 13b and 13c are connected to each other, that is, the switch 13 is turned to the terminal 13b position, the input signal is to be given to the DUT 2 through the receiving element 20. In this case, the signal outputting section 12 outputs a signal with a frequency of f2.

It is noted that in the case the input signal is given to the DUT 2 through the receiving element 20, a signal is to be input to the signal source 10 through the output terminal 18. In this case, the bridge 14b provides the signal to the receiver (TS) 16b.

The receiving element 20 has bridges 24a and 24b, a receiver (TR) 26a, a receiver (RR) 26b, and an input terminal 28. The input terminal 28 is the same as in the first embodiment. It is noted that the bridge 24a and the receiver (TR) 26a perform the same functions as in the first embodiment in the case input signal is given to the DUT 2 directly. However, the bridge 24a and the receiver (TR) 26a perform different functions from in the first embodiment in the case input signal is given to the DUT 2 through the receiving element 20. This will hereinafter be described.

When the switch 13 is turned to the terminal 13b position, an input signal output from the signal outputting section 12 is sent to the receiving element 20 through the switch 13. The bridge 24b provides the input signal to the receiver (RR) 26b. The signal provided by the bridge 24b can be considered one not affected by measurement system error factor of the receiving element 20. The bridge 24a provides a receiving side reflected signal, which is output from the input terminal 28 as the input signal and then returned back reflectively, to the receiver (TR) 26a.

The receiver (TR) 26a (receiving side reflected signal measuring element) measures the S parameter of the receiving side reflected signal received through the bridge 24a. The receiver (TR) 26a serves as both the received signal measuring element and the receiving side reflected signal measuring element.

The receiver (RR) 26b (receiving side input signal measuring element) measures the S parameter of the input signal received through the bridge 24b. Therefore, the receiver (RR) 26b measures the S parameter concerning the input signal before the occurrence of the effect of the measurement system error factor of the receiving element 20.

The measurement system error factor recording section 30 records the measurement system error factors of the network analyzer 1. The measurement system error factors include Ed, Er1, Er2, Es, Et and EL. However, there can be two cases where input signal is given to the DUT 2 directly and where input signal is given to the DUT 2 through the receiving element 20, there being made a distinction between the two cases by assigning a subscript "f (forward)" to the former, while another subscript "r (reverse)" to the latter. That is, the measurement system error factors include Edf, Er1f, Er2f, Esf, Etf, ELf, and Edr, Er1r, Er2r, Esr, Etr, ELr.

Figure 13:
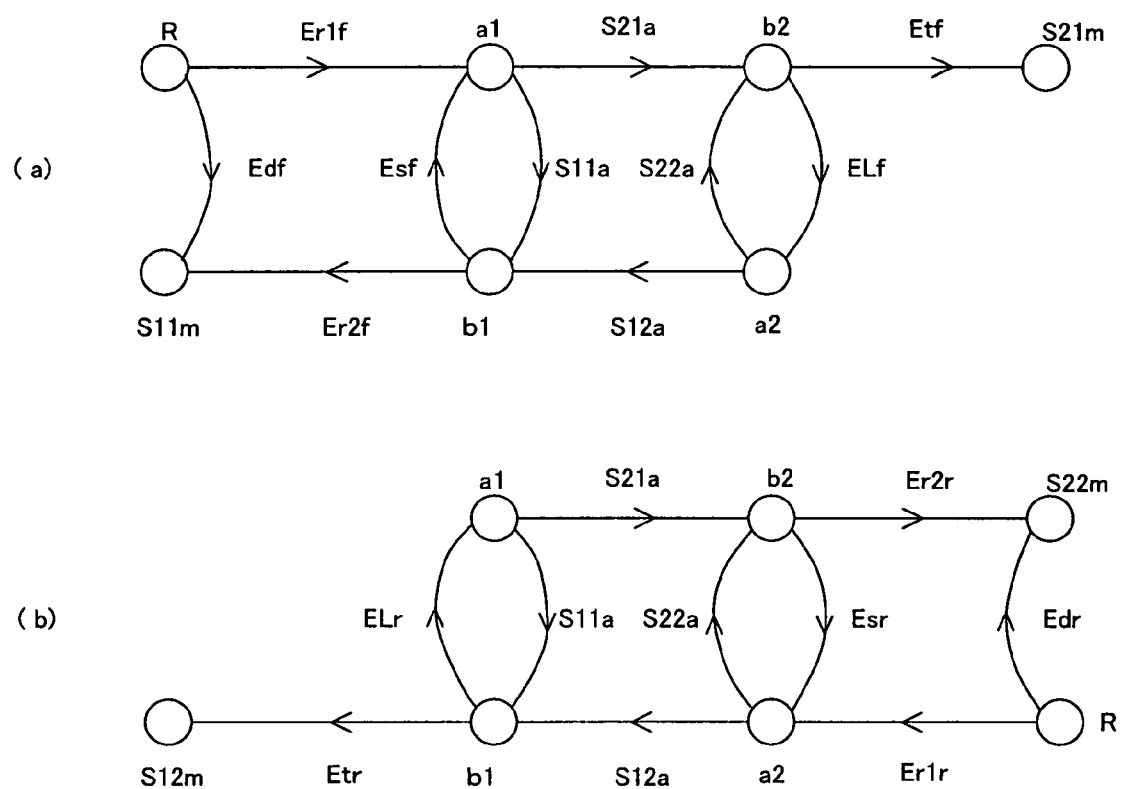
FIG. 13 is a view depicting, with a signal flow graph, the state shown in FIG. 12, including a view (FIG. 13(*a*)) showing the state where an input signal is given to a DUT 2 directly and another view (FIG. 13(*b*)) showing another state where an input signal is given to the DUT 2 through a receiving means 20.

FIG. 13 shows a representation of the state shown in FIG. 12 with a signal flow graph. FIG. 13(a) shows the state where input signal is given to the DUT 2 directly, while FIG. 13(b) shows the state where input signal is given to the DUT 2 through the receiving element 20.

The circuit parameter measuring section 40 measures the true S parameters (without any effect of the measurement system error factors) (S11a, S21a, S12a and S22a) of the DUT 2 based on:

(1) measurement data (S parameters), concerning the DUT 2, of the receiver (RS) 16a (input signal measuring element), the receiver (TS) 16b (reflected signal measuring element) and the receiver (TR) 26a (received signal measuring element) in the case input signal is given to the DUT 2 directly;

(2) measurement data (S parameters), concerning the DUT 2, of the receiver (RR) 26b (receiving side input signal measuring element), the receiver (TR) 26a (receiving side reflected signal measuring element) and the receiver (TS) 16b (reflected signal measuring element) in the case input signal is given to the DUT 2 through the receiving element 20; and (3) the measurement system error factors recorded in the measurement system error factor recording section 30.

However, the measurement data, concerning the DUT 2, of the receiver (RS) 16a (input signal measuring element), the receiver (TS) 16b (reflected signal measuring element) and the receiver (TR) 26a (received signal measuring element) in the case input signal is given to the DUT 2 directly are indicated, respectively, by R, S11m and S21m (refer to FIG. 13(a)).

Also, the measurement data, concerning the DUT 2, of the receiver (RR) 26b (receiving side input signal measuring element), the receiver (TR) 26a (receiving side reflected signal measuring element) and the receiver (TS) 16b (reflected signal measuring element) in the case input signal is given to the DUT 2 through the receiving element 20 are indicated, respectively, by R, S22m and S12m (refer to FIG. 13(b)).

It is noted that the measurement data, concerning the DUT 2, of the receiver (RS) 16a, etc. means that measured by the receiver (RS) 16a, etc. when the DUT 2 is connected to the network analyzer 1.

The measurement data, concerning the DUT 2, of the receiver (RS) 16a is that measured by the receiver (RS) 16a when the DUT 2 is connected to the network analyzer 1. The measurement data, concerning the DUT 2, of the receiver (TS) 16b is that obtained by measuring a reflected signal for the input signal reflected from the DUT 2 using the receiver (TS) 16b when the DUT 2 is connected to the network analyzer 1. Also, the receiving element 20 receives the input signal, after being output from the output terminal 18, through the DUT 2 as a received signal. Measurement data, concerning the received signal, by the receiver (TR) 26a is the measurement data, concerning the DUT 2, of the receiver (TR) 26a. These are for the case the input signal output from the signal outputting section 12 is given to the DUT 2 directly.

The measurement data, concerning the DUT 2, of the receiver (RR) 26b is that measured by the receiver (RR) 26b when the DUT 2 is connected to the network analyzer 1. The measurement data, concerning the DUT 2, of the receiver (TR) 26a is that obtained by measuring a reflected signal for the input signal reflected from the DUT 2 using the receiver (TR) 26a when the DUT 2 is connected to the network analyzer 1. Also, the signal source 10 receives the input signal after being output from the input terminal 28 through the DUT 2. Measurement data, concerning the signal, by the receiver (TS) 16b is the measurement data, concerning the DUT 2, of the receiver (TS) 16b. These are for the case the input signal output from the signal outputting section 12 is given to the DUT 2 through the receiving element 20.

The circuit parameter measuring section 40 measures S11a, S21a, S12a and S22a in accordance with the following mathematical expressions:

$$S11a = \frac{1}{D}\left\{\frac{S11m - Edf}{Er1f \cdot Er2f}\left(1 + \frac{S22m - Edr}{Er1r \cdot Er2r}Esr\right) - \left(\frac{S21m}{Etf}\frac{S12m}{Etr}ELf\right)\right\}$$ [Equation 5]

$$S21a = \frac{1}{D}\left[\left\{1 + \frac{S22m - Edr}{Er1r \cdot Er2r}(Esr - ELf)\right\}\frac{S21m}{Etf}\right]$$

$$S12a = \frac{1}{D}\left[\left\{1 + \frac{S11m - Edf}{Er1f \cdot Er2f}(Esf - ELr)\right\}\frac{S12m}{Etr}\right]$$

$$S22a = \frac{1}{D}\left\{\frac{S22m - Edr}{Er1r \cdot Er2r}\left(1 + \frac{S11m - Edf}{Er1f \cdot Er2f}Esf\right) - \left(\frac{S21m}{Etf}\frac{S12m}{Etr}ELr\right)\right\}$$

Here, $$D = \left(1 + \frac{S11m - Edf}{Er1f \cdot Er2f}Esf\right)\left(1 + \frac{S22m - Edr}{Er1r \cdot Er2r}Esr\right) - \left(\frac{S21m}{Etf}\frac{S12m}{Etr}ELfELr\right)$$

The measurement system error factor acquiring section 50 acquires the measurement system error factors (Edf, Er1f, Er2f, Esf, Etf and ELf) based on the measurement results of the receiver (RS) 16a (input signal measuring element), the receiver (TS) 16b (reflected signal measuring element), the receiver (TR) 26a (received signal measuring element), and the signal output acquiring section 62. Upon the acquisition of the measurement system error factors, a correction tool 4, a power meter 6, and the receiving element 20 are connected to the signal source 10 in sequence.

The measurement system error factor acquiring section 50 has the same configuration as in the first embodiment (refer to FIG. 3). However, the switch 52 outputs the measurement data received from the receiver (TS) 16b to the third measurement system error factor acquiring section 58. In addition, the third measurement system error factor acquiring section 58 obtains not only Etf but also ELf.

A representation of the state where the receiving element 20 is connected to the signal source 10 with a signal flow graph is as shown in FIG. 9. Here, the measurement data of the receiver (RS) 16a, the receiver (TR) 26a (received signal measuring element), and the receiver (TS) 16b (reflected signal measuring element) are indicated, respectively, by R, TR/S and TS/R. The relationship between R and TR/S and that between R and TS/R are as shown in the following mathematical expressions, though the subscript "f" is omitted:

$$\frac{TS/R}{R} = \frac{Er1Er2EL}{1 - EsEL}$$ [Equation 6]

$$\frac{TR/S}{R} = \frac{Er1Et}{1 - EsEL}$$

ELf can be obtained from the relationship between R and TS/R, and Etf can be obtained by assigning ELf to the relationship between R and TR/S.

The terminal 60 for power meter is connected to a terminal 6b of the power meter. The signal output acquiring section 62 (receiving side signal outputting element) acquires the power P through the terminal 60 for power meter and the terminal 6b, and then outputs to a second measurement system error factor acquiring section 56 and a second receiving side measurement system error factor acquiring section 76 to be described hereinafter.

The receiving side measurement system error factor acquiring section 70 acquires the measurement system error factors (Edr, Er1r, Er2r, Esr, Etr and ELr) based on the measurement results of the receiver (RR) 26b (receiving side input signal measuring element), the receiver (TR) 26a (receiving side reflected signal measuring element), the receiver (TS) 16b (reflected signal measuring element), and the signal output acquiring section 62. Upon the acquisition of the measurement system error factors, the correction tool 4, the power meter 6, and the signal source 10 are connected to the input terminal 28 of the receiving element 20 in sequence.

Figure 14:
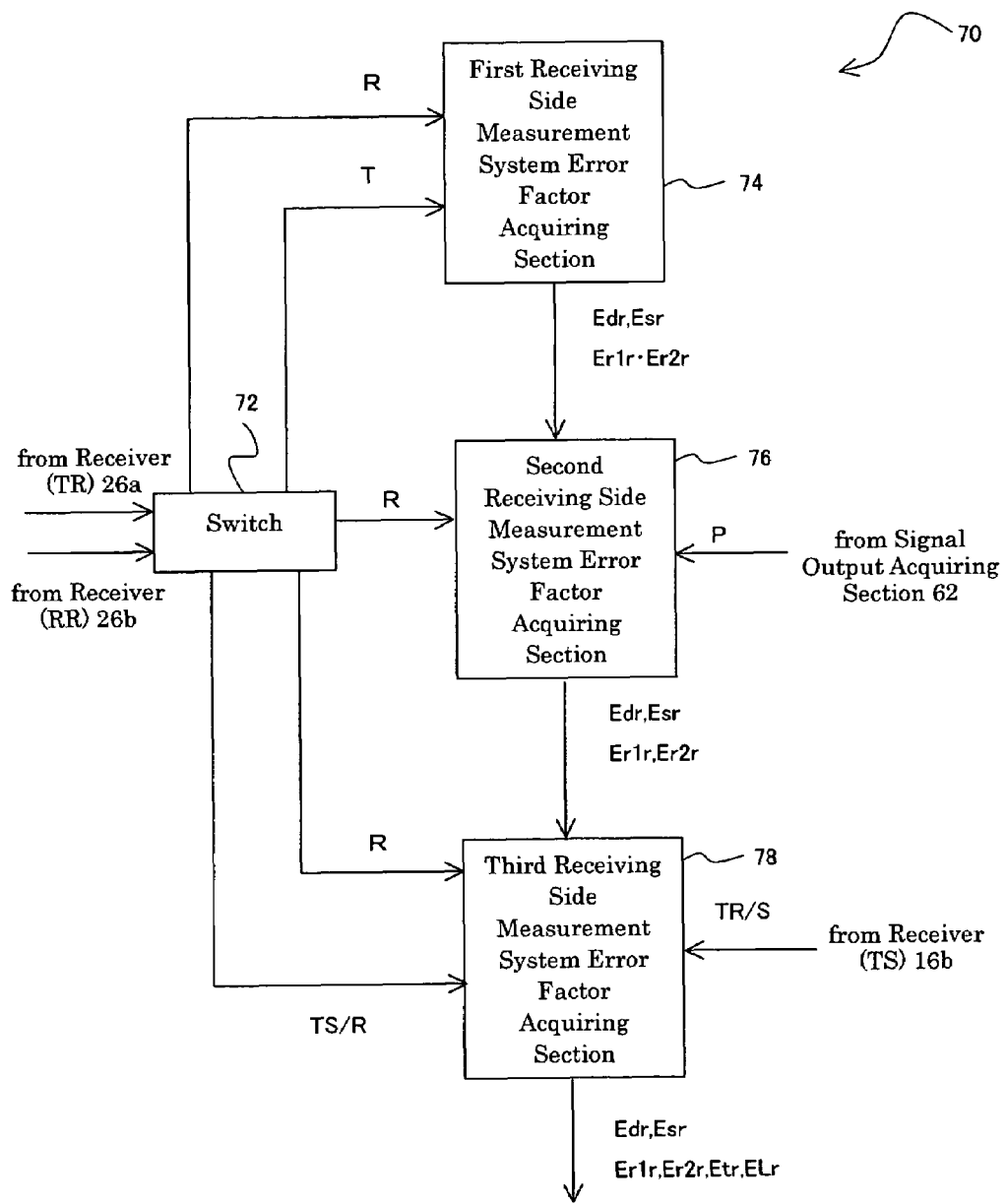
FIG. 14 is a block diagram showing the configuration of a receiving side measurement system error factor acquiring section 70.

In FIG. 14 is shown the configuration of the receiving side measurement system error factor acquiring section 70. The receiving side measurement system error factor acquiring section 70 has a switch 72, a first receiving side measurement system error factor acquiring section 74, a second receiving side measurement system error factor acquiring section 76, and a third receiving side measurement system error factor acquiring section 78.

The switch 72 receives measurement data (S parameters for example) from the receiver (RR) 26b (receiving side input signal measuring element) and the receiver (TR) 26*a* (receiving side reflected signal measuring element), and then outputs these signals to any one of the first receiving side measurement system error factor acquiring section 74, the second receiving side measurement system error factor acquiring section 76, or the third receiving side measurement system error factor acquiring section 78, in accordance with the type of an article connected to the receiving element 20.

That is, the switch 72 outputs the measurement data (S parameters for example) received from the receiver (RR) 26*b* and the receiver (TR) 26*a* to the first receiving side measurement system error factor acquiring section 74, the second receiving side measurement system error factor acquiring section 76, or the third receiving side measurement system error factor acquiring section 78, respectively, when the correction tool 4, the power meter 6, or the signal source 10 is connected to the receiving element 20. The measurement data received from the receiver (TR) 26*a*, however, may not be output to the second receiving side measurement system error factor acquiring section 76.

The first receiving side measurement system error factor acquiring section 74 receives the measurement data of the receiver (RR) 26*b* and the receiver (TR) 26*a*, when the correction tool 4 is connected to the receiving element 20, and then acquires Edr, Esr and Er1r·Er2r (the product of Er1r and Er2r). A method for acquiring Edr, Esr and Er1r·Er2r is the same as of the first measurement system error factor acquiring section 54 in the first embodiment.

The second receiving side measurement system error factor acquiring section 76 receives measurement data of the receiver (RR) 26*b*, Edr, Esr and Er1r·Er2r (measurement system error factors acquired by the first receiving side measurement system error factor acquiring section 74), and an output (power P) of the signal output acquiring section 62, when the power meter 6 is connected to the receiving element 20 and to the terminal 60 for power meter, and then acquires Er1r and Er2r. A method for acquiring Er1r and Er2r is the same as of the second measurement system error factor acquiring section 56 in the first embodiment.

The first receiving side measurement system error factor acquiring section 74 receives the measurement data of the receiver (RR) 26*b* (receiving side input signal measuring element) and the receiver (TR) 26*a* (receiving side reflected signal measuring element), and then acquires Edr, Esr, Er1r·Er2r. The second receiving side measurement system error factor acquiring section 76 receives the measurement data of the receiver (RR) 26*b* (receiving side input signal measuring element) and the signal output acquiring section 62, and then acquires Er1r and Er2r. Therefore, the first receiving side measurement system error factor acquiring section 74 and the second receiving side measurement system error factor acquiring section 76 acquire the receiving side measurement system error factors (Edr, Esr, Er1r and Er2r) based on the measurement data of the receiver (RR) 26*b* (receiving side input signal measuring element), the receiver (TR) 26*a* (receiving side reflected signal measuring element), and the signal output acquiring section 62 (receiving side signal output acquiring element).

The third receiving side measurement system error factor acquiring section 78 receives measurement data of the receiver (RR) 26*b* and the receiver (TR) 26*a* Edr, Esr, Er1r and Er2r (measurement system error factors acquired by the second receiving side measurement system error factor acquiring section 76), and measurement data of the receiver (TS) 16*b*, when the signal source 10 is connected to the receiving element 20, and then acquires Etr and ELr. A method for acquiring Etr and ELr is the same as the third measurement system error factor acquiring section 58 in the first embodiment.

The third receiving side measurement system error factor acquiring section 78 outputs Edr, Esr, Er1r, Er2r, Etr and ELr to the measurement system error factor recording section 30.

Figure 15:
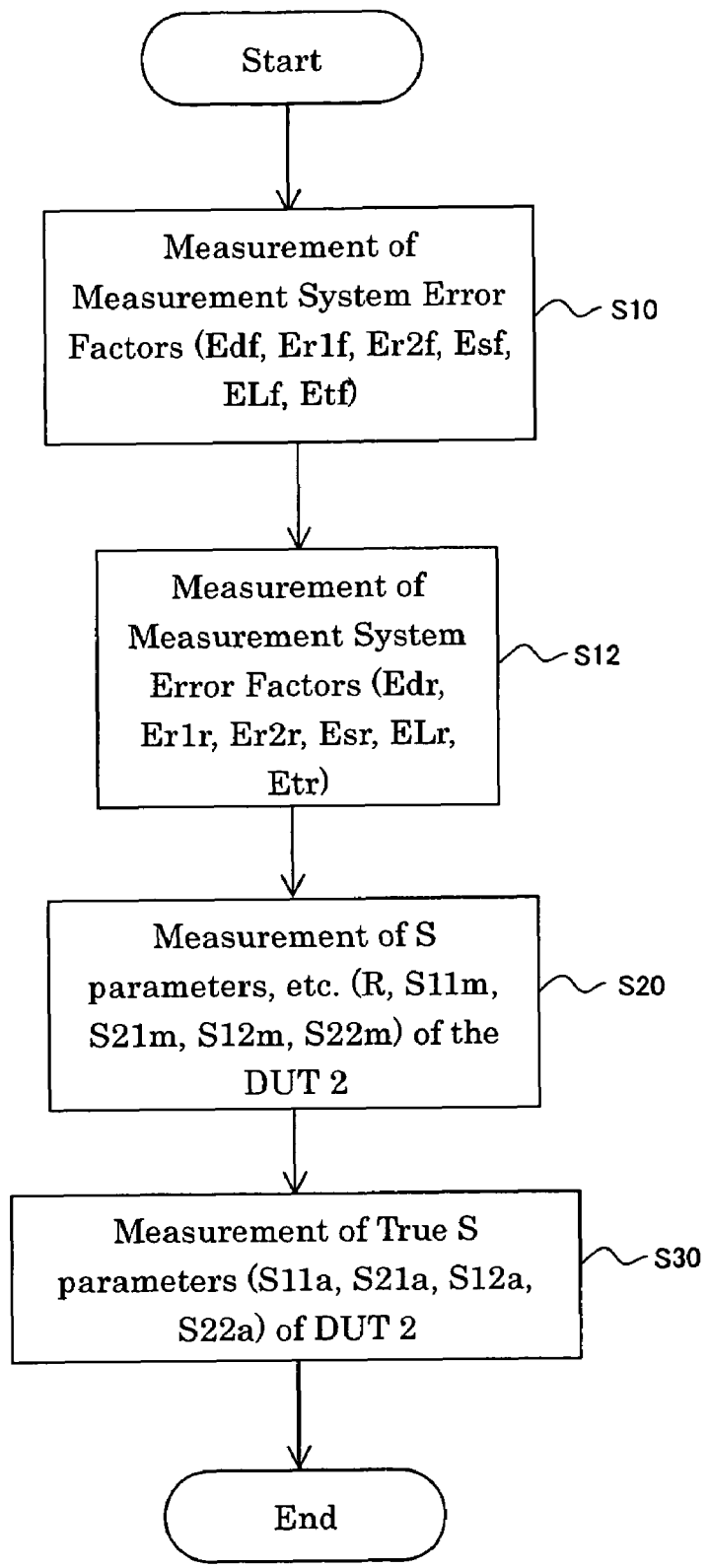
FIG. 15 is a flow chart showing the operation of the second embodiment.

Next, the operation of the second embodiment will be described. FIG. 15 is a flow chart showing the operation of the second embodiment.

Figure 16:
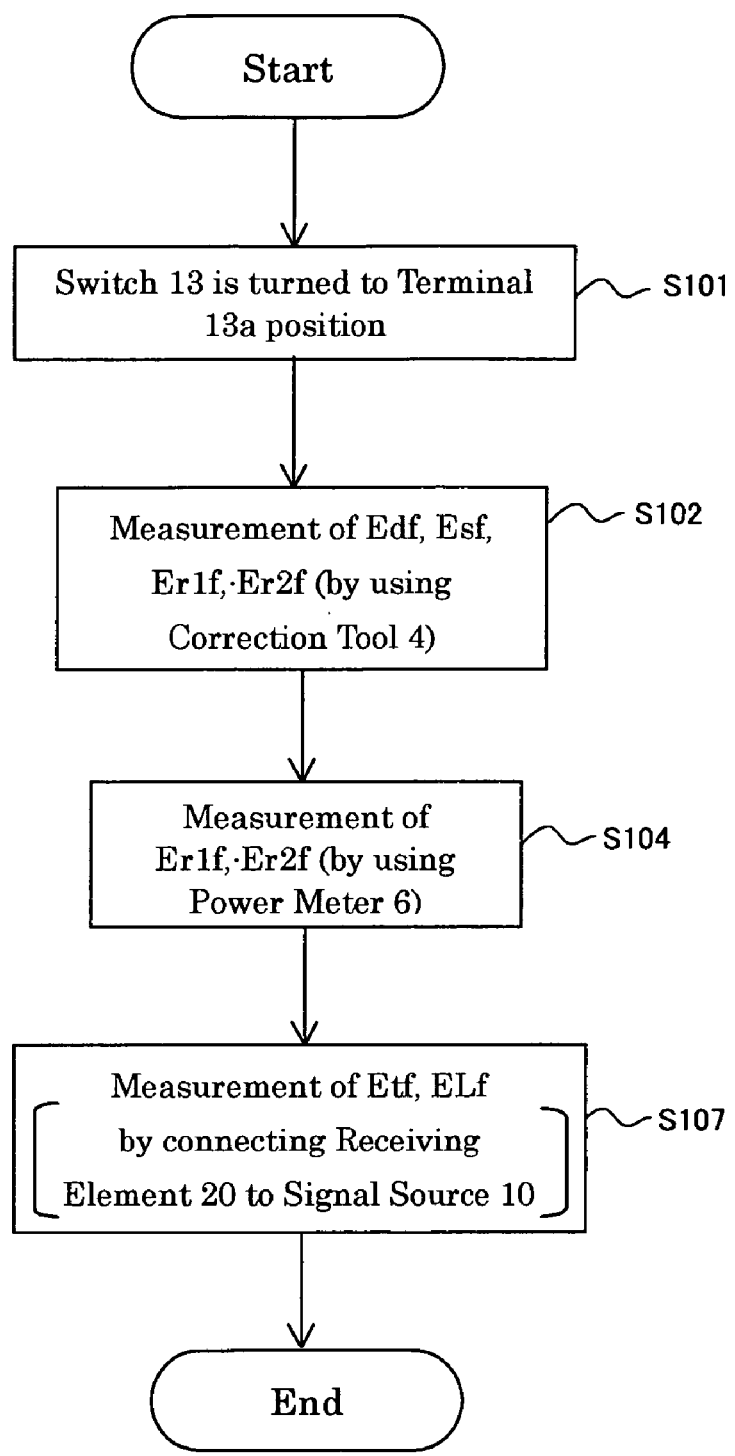
FIG. 16 is a flow chart showing the operation when measuring measurement system error factors.

First, the network analyzer 1 measures the measurement system error factors (Edf, Esf, Er1f, Er2f, Etf and ELf) (S10). The measurement system error factors measured are recorded in the measurement system error factor recording section 30. The operation when measuring the measurement system error factors is explained with reference to the flow chart in FIG. 16.

First, the switch 13 is turned to the terminal 13*a* position (S101). Then, three kinds of the correction tools 4 are connected to the signal source 10. The signal outputting section 12 outputs an input signal. The receiver (RS) 16*a* measures the input signal. The input signal is input to the correction tool 4 through the output terminal 18. Then, the receiver (TS) 16*b* measures a reflected signal from the correction tool 4. The first measurement system error factor acquiring section 54 receives the measurement data of the receiver (RS) 16*a* and the receiver (TS) 16*b*, and then acquires Edf, Esf, Er1f·Er2f (the product of Er1f and Er2f) (S102).

Next, the power meter 6 is connected to the signal source 10 and to the terminal 60 for power meter. The signal outputting section 12 outputs an input signal. The receiver (RS) 16*a* measures the input signal. The input signal is input to the power meter 6 through the output terminal 18 and the terminal 6*a*. The power meter 6 measures the power P of the input signal. Then, the signal output acquiring section 62 acquires the power P through the terminal 60 for power meter and the terminal 6*b*, and then outputs to the second measurement system error factor acquiring section 56. The second measurement system error factor acquiring section 56 receives the measurement data of the receiver (RS) 16*a*, Edf, Esf and Er1·Er2f (measurement system error factors acquired by the first measurement system error factor acquiring section 54), and the output (power P) of the signal output acquiring section 62, and then acquires Er1f and Er2f (S104).

Finally, the receiving element 20 is connected to the signal source 10. The signal outputting section 12 outputs an input signal. The receiver (RS) 16*a* measures the input signal. The input signal is received by the receiving element 20 through the output terminal 18 and the input terminal 28 as a received signal. The receiver (TR) 26*a* measures the received signal. Also, the receiver (TS) 16*b* measures a reflected signal for the input signal reflected from the receiving element 20. Then, the third measurement system error factor acquiring section 58 receives the measurement data of the receiver (RS) 16*a*, Edf, Esf, Er1f and Er2f (measurement system error factors acquired by the second measurement system error factor acquiring section 56), and the measurement data of the receiver (TS) 16*b* and the receiver (TR) 26*a*, and then acquires Etf and ELf (S107).

Figure 17:
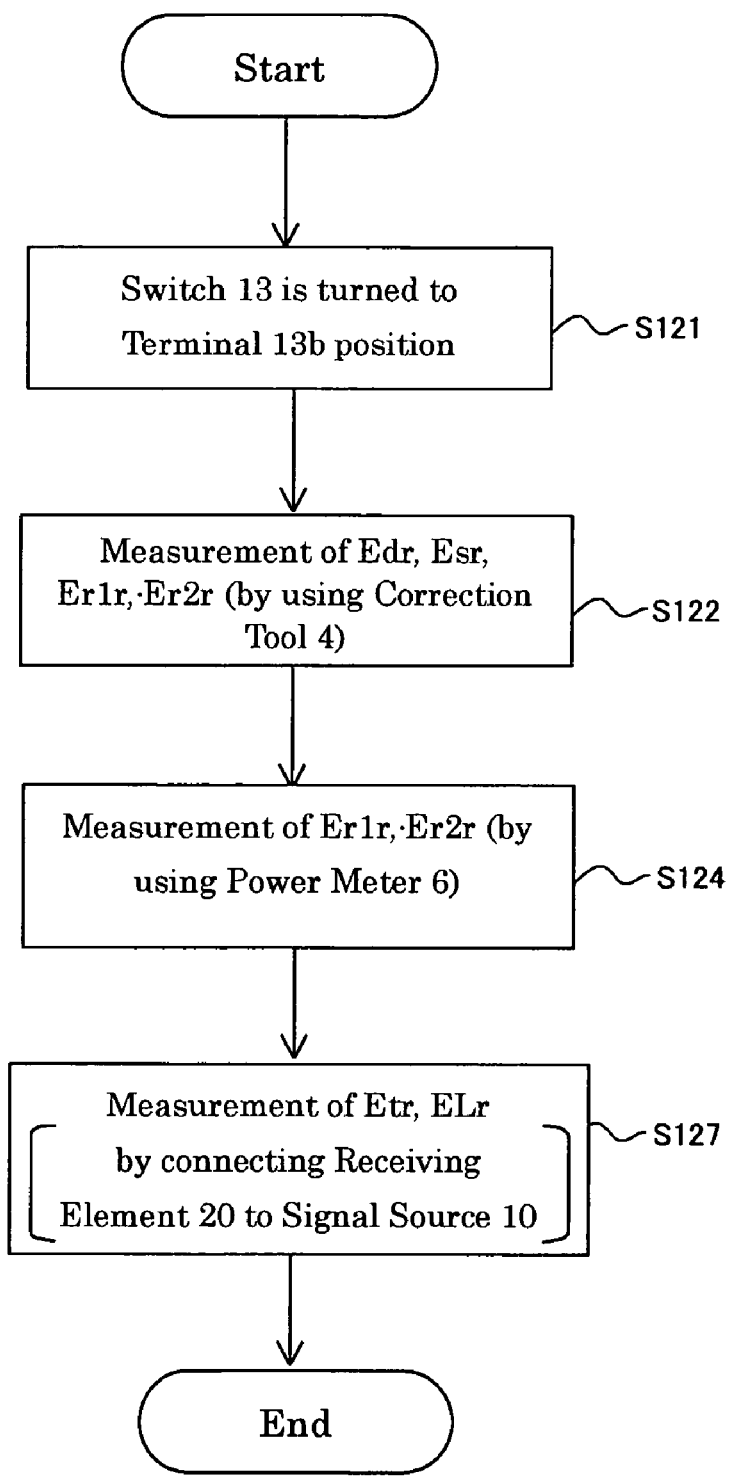
FIG. 17 is a flow chart showing the operation when measuring measurement system error factors.

Next, the network analyzer 1 measures the measurement system error factors (Edr, Esr, Er1r, Er2r, Etr and ELr) (S12). The measurement system error factors measured are recorded in the measurement system error factor recording section 30. The operation when measuring the measurement system error factors is explained with reference to the flow chart in FIG. 17.

First, the switch 13 is turned to the terminal 13*b* position (S121). Then, three kinds of the correction tools 4 are connected to the receiving element 20. The signal outputting section 12 outputs an input signal. The receiver (RR) 26b measures the input signal. The input signal is input to the correction tool 4 through the input terminal 28. Then, the receiver (TR) 26a measures a reflected signal from the correction tool 4. The first receiving side measurement system error factor acquiring section 74 receives the measurement data of the receiver (RR) 26b and the receiver (TR) 26a, and then acquires Edr, Esr, Er1r·Er2r (the product of Er1r and Er2r) (S122).

Next, the power meter 6 is connected to the receiving element 20 and to the terminal 60 for power meter. The signal outputting section 12 outputs an input signal. The receiver (RR) 26b measures the input signal. The input signal is input to the power meter 6 through the input terminal 28 and the terminal 6a. The power meter 6 measures the power P of the input signal. Then, the signal output acquiring section 62 acquires the power P through the terminal 60 for power meter and the terminal 6b, and then outputs to the second receiving side measurement system error factor acquiring section 76. The second receiving side measurement system error factor acquiring section 76 receives the measurement data of the receiver (RR) 26b, Edr, Esr and Er1r·Er2r (measurement system error factors acquired by the first receiving side measurement system error factor acquiring section 74), and the output (power P) of the signal output acquiring section 62, and then acquires Er1r and Er2r (S124).

Finally, the receiving element 20 is connected to the signal source 10. The signal outputting section 12 outputs an input signal. The receiver (RR) 26b measures the input signal. The input signal is received by the signal source 10 through the input terminal 28 and the output terminal 18. The receiver (TS) 16b measures the signal. Also, the receiver (TR) 26a measures a reflected signal from the signal source 10. Then, the third receiving side measurement system error factor acquiring section 78 receives the measurement data of the receiver (RR) 26b, Edr, Esr, Er1r and Er2r (measurement system error factors acquired by the second receiving side measurement system error factor acquiring section 76), and. the measurement data of the receiver (TR) 26a and the receiver (TS) 16b, and then acquires Etr and ELr (S127).

Referring now back to FIG. 15, the DUT 2 is connected to the network analyzer 1 (refer to FIG. 12) and the S parameters, etc. (R, S11m, S21m, S12m and S22m) of the DUT 2 are measured (S20).

That is, the switch 13 is turned to the terminal 13a position. In this case, the signal outputting section 12 outputs an input signal. The receiver (RS) 16a measures the input signal. Data obtained in this measurement is found to be R. The input signal is input to the DUT 2 through the output terminal 18. Then, the receiver (TS) 16b measures a reflected signal from the DUT 2. Data obtained in this measurement is found to be S11m. The receiving element 20 receives the input signal, after being output from the output terminal 18, through the DUT 2 as a received signal. The receiver (TR) 26a measures the received signal. Data obtained in this measurement is found to be S21m (refer to FIG. 13(a)).

Also, the switch 13 is turned to the terminal 13b position. In this case, the signal outputting section 12 outputs an input signal and provides to the receiving element 20. The receiver (RR) 26b measures the input signal. Data obtained in this measurement is found to be R. The input signal is input to the DUT 2 through the input terminal 28. Then, the receiver (TR) 26a measures a reflected signal from the DUT 2. Data obtained in this measurement is found to be S22m. The signal source 10 receives the input signal, after being output from the input terminal 28, through the DUT 2. The receiver (TS) 16b measures the signal. Data obtained in this measurement is found to be S12m (refer to FIG. 13(b)).

These data measured above are sent to the circuit parameter measuring section 40.

Finally, the circuit parameter measuring section 40 measures the true S parameters (S11a, S21a, S12a and S22a) of the DUT 2 based on the S parameters, concerning the DUT 2, of the receiver (RS) 16a, the receiver (TS) 16b and the receiver (TR) 26a in the case the input signal is given to the DUT 2 directly, the S parameters, concerning the DUT 2, of the receiver (RR) 26b, the receiver (TR) 26a and the receiver (TS) 16b in the case the input signal is given to the DUT 2 through the receiving element 20, and the measurement system error factors recorded in the measurement system error factor recording section 30 (S30).

In accordance with the second embodiment, the signal output acquiring section 62 acquires the power P of an input signal after the occurrence of receiving side measurement system error factors. This allows errors Er1r and Er2r (Er1f and Er2f), etc. due to frequency tracking to be separated depending on the direction thereof (in a signal flow graph). In the case where the frequency f1 of the input signal of the DUT 2 is different from the frequency f2 of the output signal thereof, errors Er1 and Er2, etc. due to frequency tracking vary depending on the direction thereof. Therefore, it is possible to correct measurement system errors by separating the receiving side measurement system error factors depending on the direction thereof.

Also, the receiver (TS) 16b measures the S parameter concerning a signal received by the signal source 10, which makes it possible to acquire measurement system error factors Etr and ELr in the signal source 10. In the case where the frequency f1 of the input signal of the DUT 2 is different from the frequency f2 of the output signal thereof, the measurement system error factors Etr and ELr in the signal source 10 cannot be ignored. Therefore, it is possible to correct measurement system errors by acquiring the measurement system error factors Etr and ELr in the signal source 10. It is noted that since the receiver (TR) 26a measures the S parameter of the received signal, measurement system error factors Etf and ELf of the receiving element 20 can also be acquired.

Thus, as the measurement system error factors Er1r and Er2r (Er1f and Er2f) are separated depending on the direction thereof and further the measurement system error factors Etr and ELr in the signal source 10 and those Etf and ELf of the receiving element 20 are acquired, in combination with the measurement results, concerning the DUT 2, of the receiver (RS) 16a, the receiver (TS) 16b and the receiver (TR) 26a in the case input signal is given to the DUT 2 directly and those, concerning the DUT 2, of the receiver (RR) 26b, the receiver (TR) 26a and the receiver (TS) 16b in the case input signal is given to the DUT 2 through the receiving element 20, it is possible to measure the S parameters concerning the DUT 2 while correcting errors.

Figure 18:
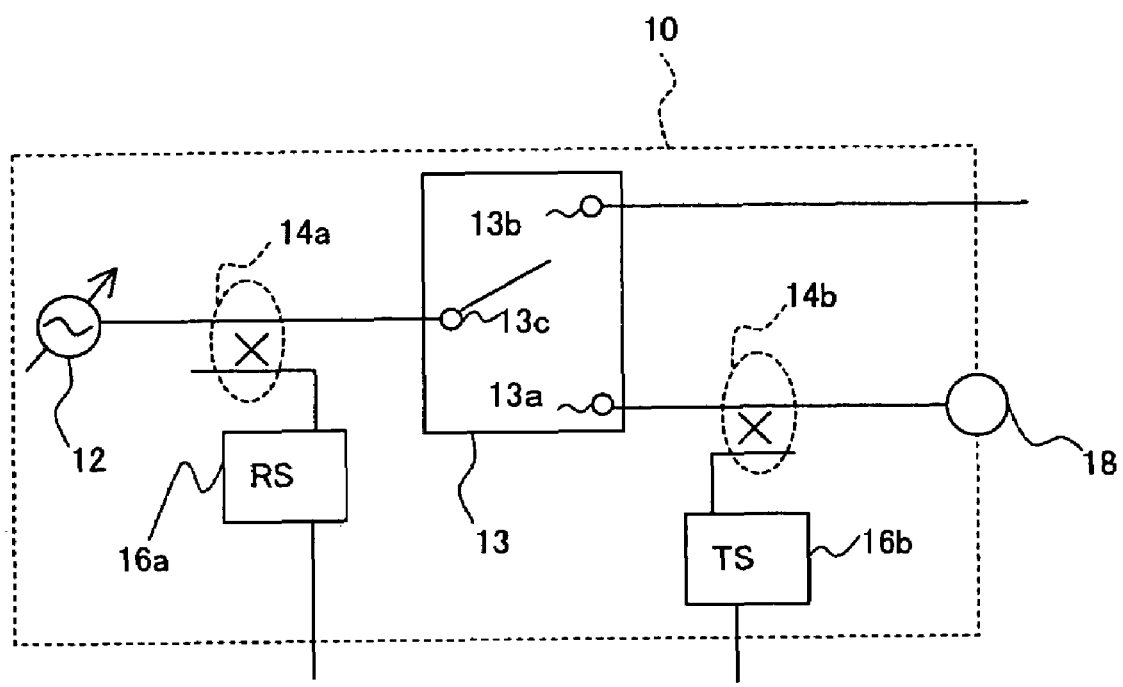
FIG. 18 is a block diagram showing the configuration in the case of arranging a switch 13 between a bridge 14*a* and another bridge 14*b*.

It is noted that the switch 13 is arranged between the bridge 14a and the signal outputting section 12 in FIG. 12. However, the switch 13 may be arranged between the bridge 14a and the bridge 14b. In FIG. 18 is shown the configuration in the case where the switch 13 is arranged between the bridge 14a and the bridge 14b. The terminal 13c is connected to the signal outputting section 12 through the bridge 14a.

Figure 19:
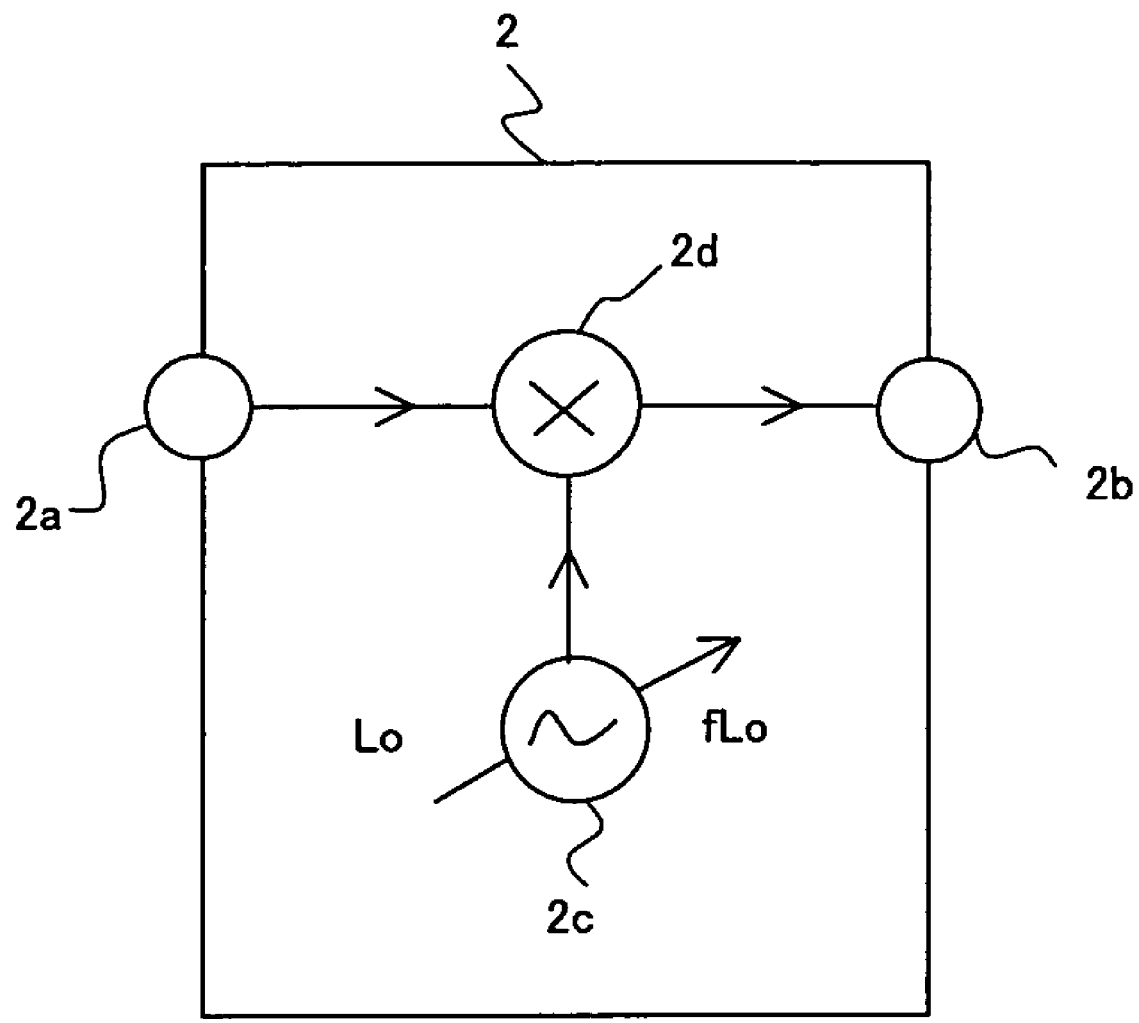
FIG. 19 is a view showing the configuration of the DUT 2 in the case of using a mixer as the DUT 2.
Figure 20:
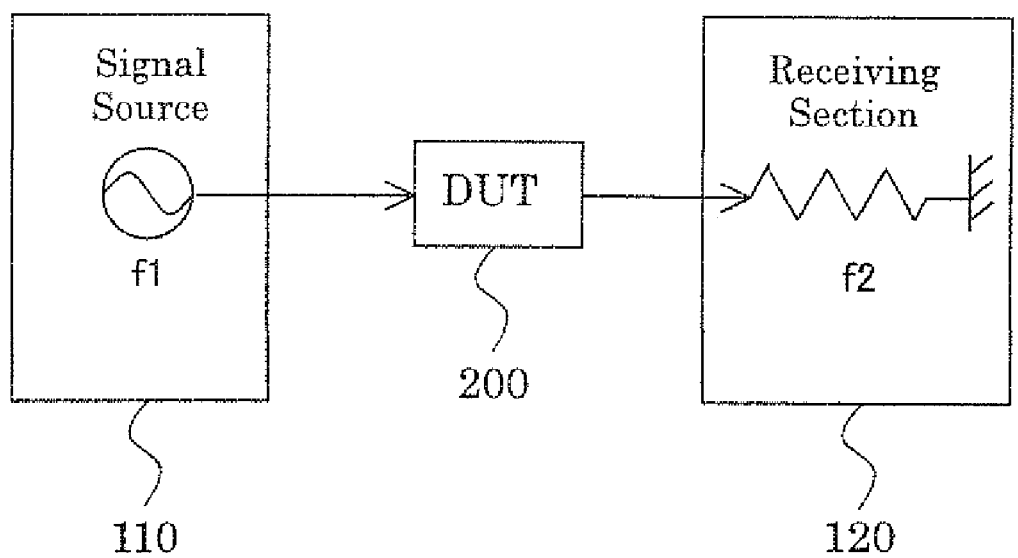
FIG. 20 is a view illustrating a method for measuring circuit parameters of a device under test (DUT) according to prior art.
Figure 21:
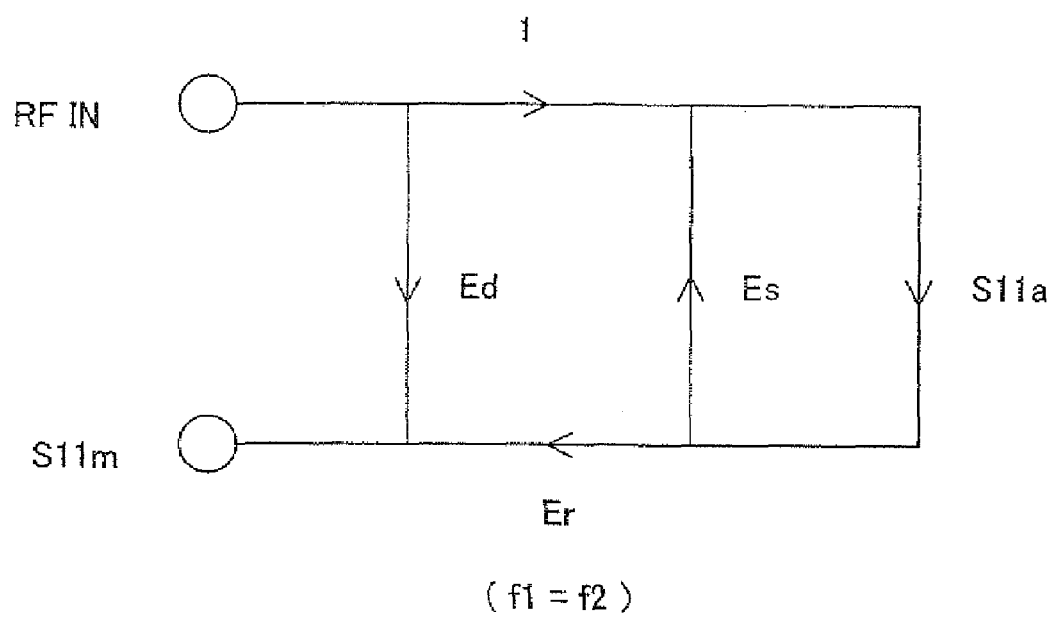
FIG. 21 is a signal flow graph in regard to a signal source 110 in the case, according to prior art, of a frequency equality f1=f2.
Figure 22:
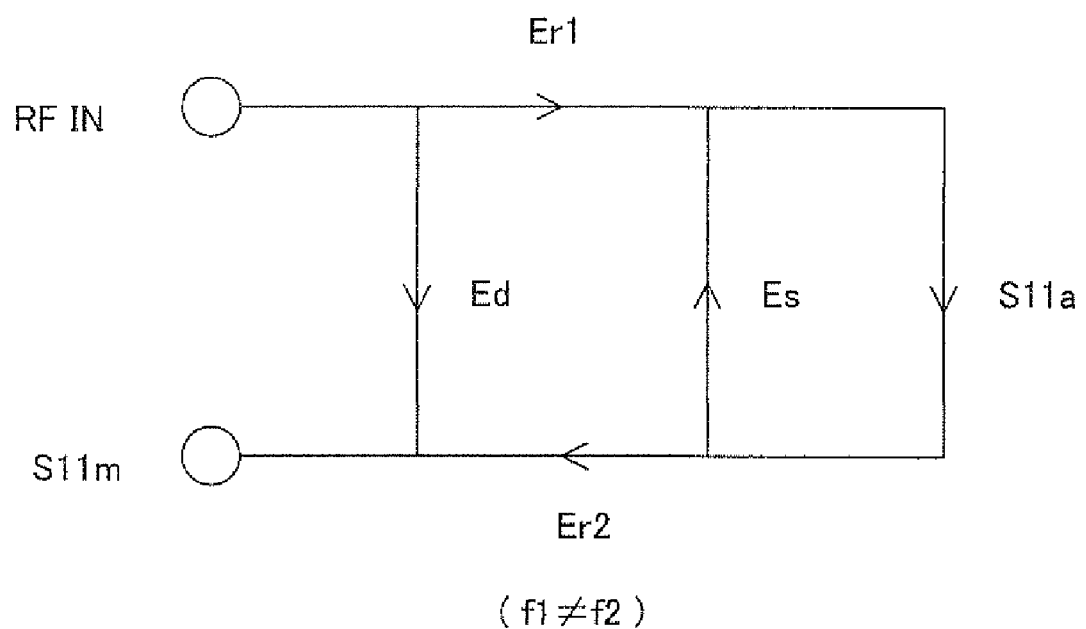
FIG. 22 is a signal flow graph in regard to the signal source 110 in the case, according to prior art, where the frequency f1 is not equal to the frequency f2.
Figure 23:
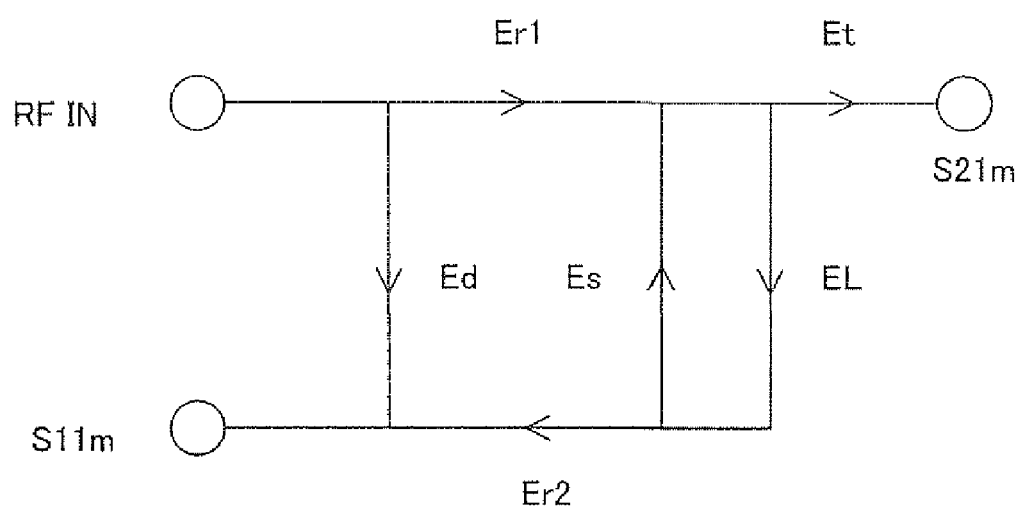
FIG. 23 is a signal flow graph in the case, according to prior art, where the signal source 110 and a receiving section 120 are coupled directly.

In addition, a mixer as shown in FIG. 19 can also be used as the DUT 2. The DUT 2 has an input terminal 2a, an output terminal 2b, a local signal generator 2c and a multiplier 2d. The input terminal 2a and the output terminal 2b are as mentioned above. The local signal generator 2c provides a local signal with a frequency of fLo (variable) to the multiplier 2d. The multiplier 2d multiplies a signal (with a frequency of f1) provided through the input terminal 2a by the local signal (with a frequency of fLo), and provides the result to the output terminal 2b. In this case, f2=f1±fLo is obtained whereby f1≠f2 becomes true. The above-described embodiment can also be applied to such a case.

It is noted that in the above-described embodiment, a medium reader of a computer comprising a CPU, a hard disk and a medium (floppy disk, CD-ROM, etc.) reader reads media containing programs for realizing each part above and install the programs in the hard disk. A network analyzer can be realized in such a way as above.

Also in the first embodiment, the correction tool 4, the power meter 6, and the receiving element 20 are to be connected to the signal source 10 in sequence. However, connecting the correction tool 4, etc. in sequence requires a large amount of labor. Hence, various variants about the first embodiment can be cited as will be described hereinafter.

(c) First Variant of the First Embodiment

Figure 24:
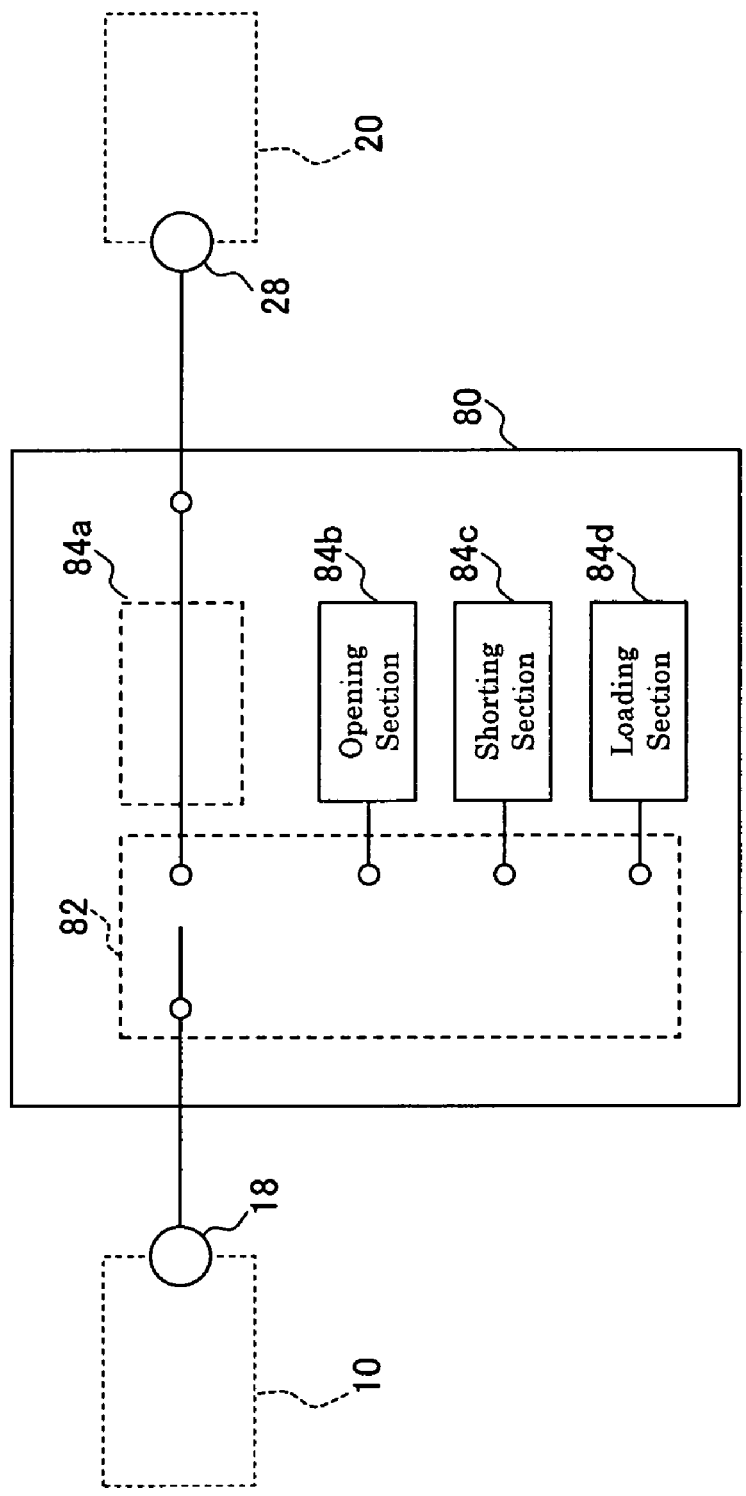
FIG. 24 is a view showing the state where a calibration kit 80 in a first variant of the first embodiment is connected to the signal source 10 and to the receiving means 20.

FIG. 24 is a view showing the state where a calibration kit 80, which can realize four kinds of conditions of direct coupling (between the signal source 10 and the receiving element 20), opening, shorting and loading (standard loading Z0), is connected to the signal source 10 and to the receiving element 20. It is noted that components other than the output terminal 18 of the signal source 10 are omitted in FIG. 24. Further, components other than the input terminal 28 of the receiving element 20 are also omitted in the figure.

The calibration kit 80 has a first switch (first input signal providing element) 82, a direct coupling section 84a, a first opening section 84b, a first shorting section 84c, and a first loading section 84d.

The first switch (first input signal providing element) 82 connects any one of the direct coupling section 84a, the first opening section 84b, the first shorting section 84c, or the first loading section 84d to the output terminal 18 of the signal source 10. The components to be connected to the output terminal 18 can be switched from one to another. The switching is preferably performed automatically. Switching "automatically" here means that such switching can be performed without any manual switching operation by users.

The direct coupling section 84a couples the input terminal 28 of the receiving element 20 and the first switch 82 directly. The first opening section 84b is for realizing opening among the correction tools 4. The first shorting section 84c is for realizing shorting among the correction tools 4. The first loading section 84d is for realizing loading (standard loading Z0) among the correction tools 4.

When the first switch 82 connects the output terminal 18 and the direct coupling section 84a to each other, the signal source 10 and the receiving element 20 are to be coupled directly. When the first switch 82 connects the output terminal 18 and the first opening section 84b to each other, and then connects the output terminal 18 and the first shorting section 84c to each other, and further connects the output terminal 18 and the first loading section 84d to each other, the three kinds of correction tools 4 are to be connected to the signal source 10.

The first switch 82 preferably sends information indicating what the output terminal 18 is connected with to the switch 52 when the components to be connected to the output terminal 18 are switched. This allows the switch 52 to operate according to the switching, by the first switch 82, of the components to be connected to the output terminal 18.

In that way, connecting the correction tool 4 and the receiving element 20 to the signal source 10 can be automated.

(d) Second Variant of the First Embodiment

Figure 25:
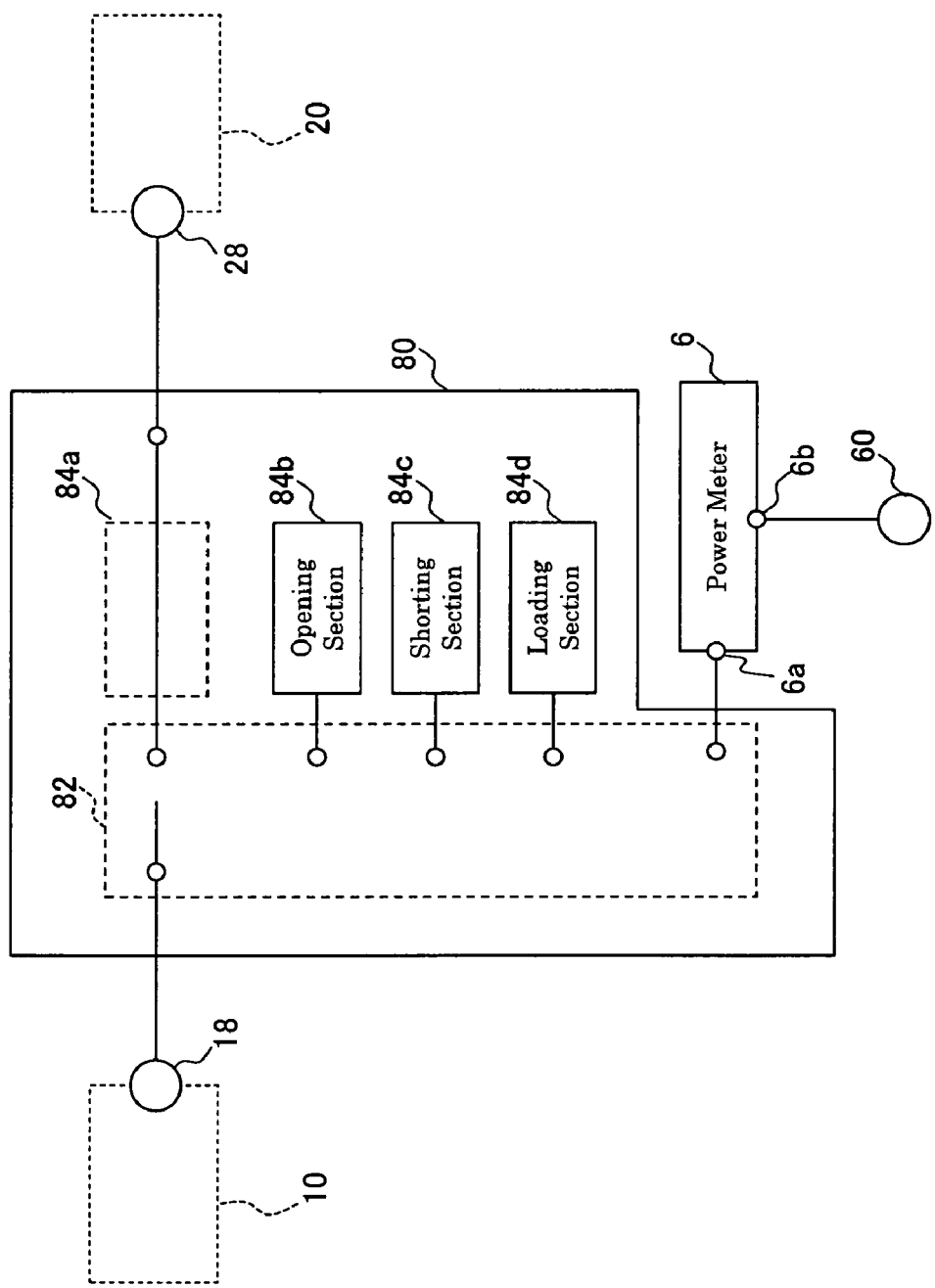
FIG. 25 is a view showing the state where a calibration kit 80 in a second variant of the first embodiment is connected to the signal source 10 and to the receiving means 20.

FIG. 25 is a view showing the state where the calibration kit 80 shown in FIG. 24 with the (first) power meter 6 being connected thereto constantly is connected to the signal source 10 and to the receiving element 20. Hereinafter, the same numerals are assigned to the same components in FIG. 24 to omit descriptions thereof.

The first switch 82 connects any one of the direct coupling section 84a, the first opening section 84b, the first shorting section 84c, the first loading section 84d, or the power meter 6 to the output terminal 18 of the signal source 10. The components to be connected to the output terminal 18 can be switched from one to another. The switching is preferably performed automatically.

It is noted that the terminal 6a of the (first) power meter 6 is connected to the first switch 82, while the terminal 6b of the power meter 6 is connected to the terminal 60 for power meter.

When the first switch 82 connects the output terminal 18 and the terminal 6a to each other, the signal source 10 and the power meter 6 are to be connected to each other.

In that way, connecting the correction tool 4, the (first) power meter 6, and the receiving element 20 to the signal source 10 can be automated.

(e) Third Variant of the First Embodiment

Figure 26:
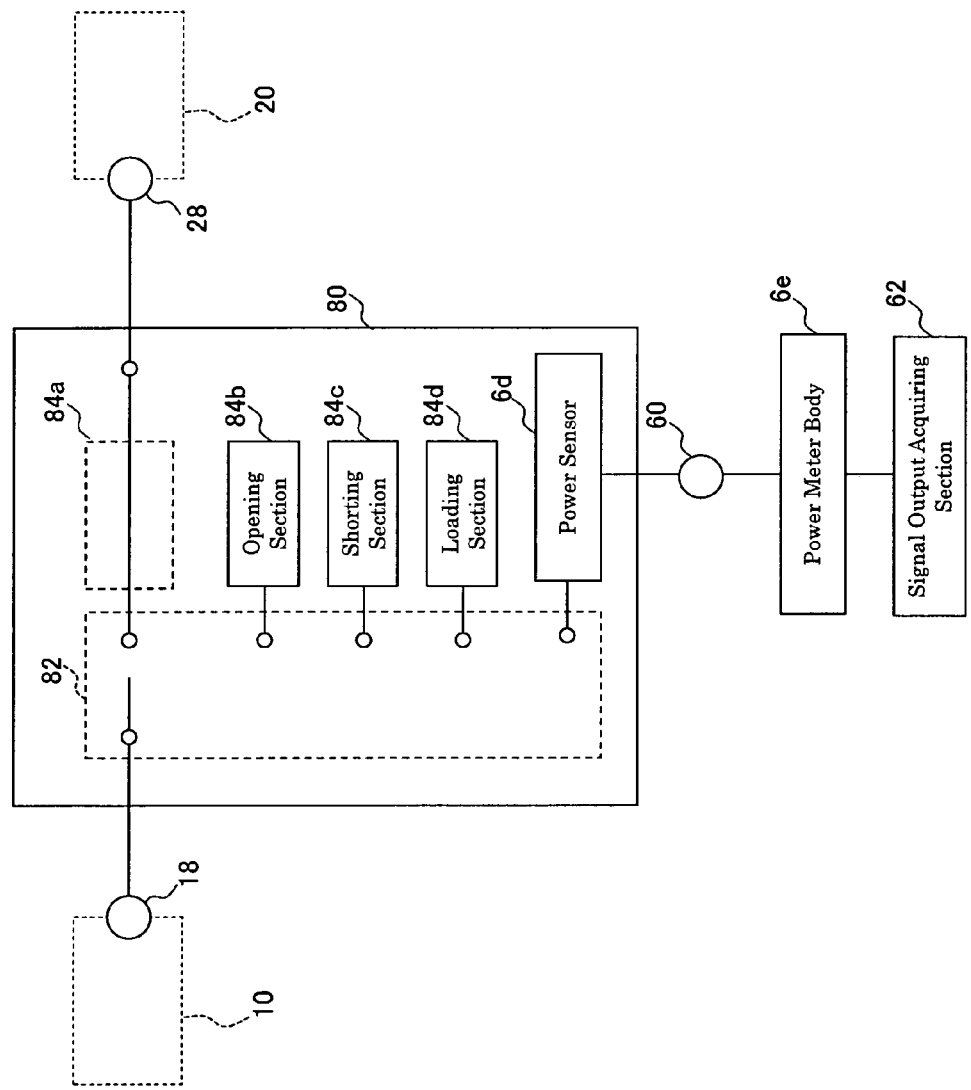
FIG. 26 is a view showing the state where a calibration kit 80 in a third variant of the first embodiment is connected to the signal source 10 and to the receiving means 20.

FIG. 26 is a view showing the state where the calibration kit 80 shown in FIG. 24 with a first power sensor 6d being included therein is connected to the signal source 10 and to the receiving element 20. Hereinafter, the same numerals are assigned to the same components in FIG. 24 and FIG. 25 to omit descriptions thereof.

The first switch 82 connects any one of the direct coupling section 84a, the first opening section 84b, the first shorting section 84c, the first loading section 84d, or the first power sensor 6d to the output terminal 18 of the signal source 10. The components to be connected to the output terminal 18 can be switched from one to another. The switching is preferably performed automatically.

It is noted that the first power sensor 6d is for converting the power of received signal into predetermined physical quantity (voltage for example). Output of the first power sensor 6d is processed by a first power meter body 6e to measure the power of signal received by the first power sensor 6d. This means that the first power sensor 6d and the first power meter body 6e serve as the (first) power meter 6.

The first power sensor 6d built in the calibration kit 80 is connected to the first power meter body 6e through the terminal 60 for power meter. The first power meter body 6e is provided in the network analyzer 1, and is connected to the signal output acquiring section 62.

When the first switch 82 connects the output terminal 18 and the first power sensor 6d to each other, the signal source 10 is to be connected to the first power sensor 6d and the first power meter body 6e (serving as the power meter 6).

In that way, connecting the correction tool 4, the (first) power meter 6, and the receiving element 20 to the signal source 10 can be automated. Furthermore, it is not necessary to keep connecting the (first) power meter 6 itself to the calibration kit 80.

Also in the second embodiment, the correction tool 4, the power meter 6, and the receiving element 20 are to be connected to the signal source 10 in sequence, and the correction tool 4, the power meter 6, and the signal source 10 are to be connected to the receiving element 20 in sequence. However, connecting the correction tool 4, etc. in sequence requires a large amount of labor. Hence, various variants about the second embodiment can be cited as will be described hereinafter.

(f) First Variant of the Second Embodiment

Figure 27:
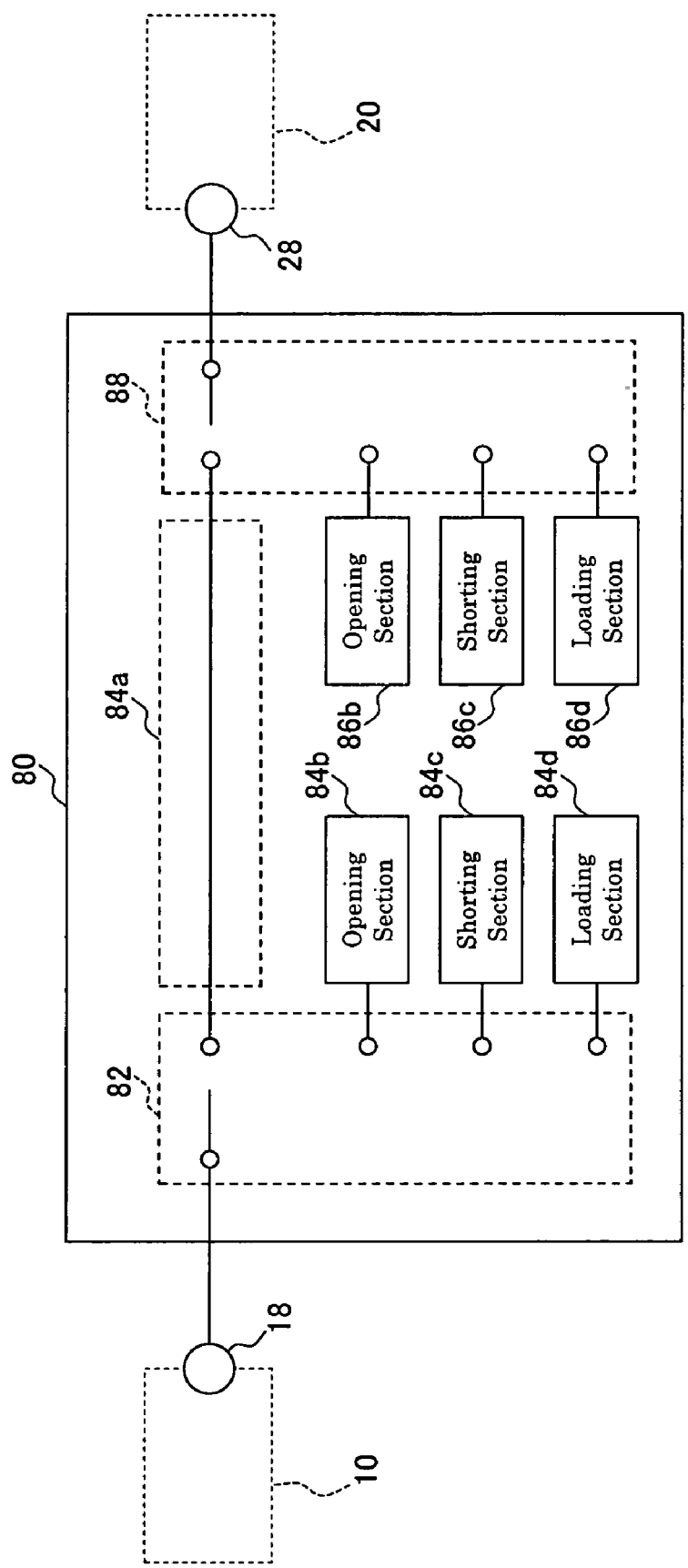
FIG. 27 is a view showing the state where a calibration kit 80 in a first variant of the second embodiment is connected to the signal source 10 and to the receiving means 20.

FIG. 27 is a view showing the state where a calibration kit 80, which can realize direct coupling (between the signal source 10 and the receiving element 20), opening, shorting and loading (standard loading Z0) in regard to the signal source 10 and the receiving element 20, is connected to the signal source 10 and to the receiving element 20. It is noted that components other than the output terminal 18 of the signal source 10 are omitted in FIG. 27. Further, components other than the input terminal 28 of the receiving element 20 are also omitted in the figure.

The calibration kit 80 has a first switch 82, a second switch 88, a direct coupling section 84a, a first opening section 84b, a second opening section 86b, a first shorting section 84c, a second shorting section 86c, a first loading section 84d, and a second loading section 86d.

The first switch 82, the direct coupling section 84a, the first opening section 84b, the first shorting section 84c, and the first loading section 84d are the same as shown in FIG. 24 and descriptions thereof will be omitted. The direct coupling section 84a, however, couples the first switch 82 and the second switch 88 directly.

The second opening section 86b is for realizing opening among the correction tools 4. The second shorting section 86c is for realizing shorting among the correction tools 4. The second loading section 86d is for realizing loading (standard loading Z0) among the correction tools 4.

The switch 88 connects any one of the direct coupling section 84a, the second opening section 86b, the second shorting section 86c, or the second loading section 86d to the input terminal 28 of the receiving element 20. The components to be connected to the input terminal 28 can be switched from one to another. The switching is preferably performed automatically. Additionally, in the case the switch 82 connects the output terminal 18 and the direct coupling section 84a to each other, the switch 88 is also adapted in such a manner as to connect the input terminal 28 and the direct coupling section 84a to each other.

When the switch 82 connects the output terminal 18 and the direct coupling section 84a to each other, the switch 88 also connects the input terminal 28 and the direct coupling section 84a to each other, whereby the signal source 10 and the receiving element 20 are to be coupled directly. When the switch 82 connects the output terminal 18 and the first opening section 84b to each other, and then connects the output terminal 18 and the first shorting section 84c to each other, and further connects the output terminal 18 and the first loading section 84d to each other, the three kinds of correction tools 4 are to be connected to the signal source 10.

The switch 82 preferably sends information indicating what the output terminal 18 is connected with to the switch 52 when the components to be connected to the output terminal 18 are switched. This allows the switch 52 to operate according to the switching, by means of the switch 82, of the components to be connected to the output terminal 18.

In that way, connecting the correction tool 4 and the receiving element 20 to the signal source 10 can be automated.

When the switch 88 connects the input terminal 28 and the second opening section 86b to each other, and then connects the input terminal 28 and the second shorting section 86c to each other, and further connects the input terminal 28 and the second loading section 86d to each other, the three kinds of correction tools 4 are to be connected to the receiving element 20.

The switch 88 preferably sends information indicating what the input terminal 28 is connected with to the switch 72 when the components to be connected to the input terminal 28 are switched. This allows the switch 72 to operate according to the switching, by means of the switch 88, of the components to be connected to the input terminal 28.

In that way, connecting the correction tool 4 and the signal source 10 to the receiving element 20 can be automated.

(g) Second Variant of the Second Embodiment

Figure 28:
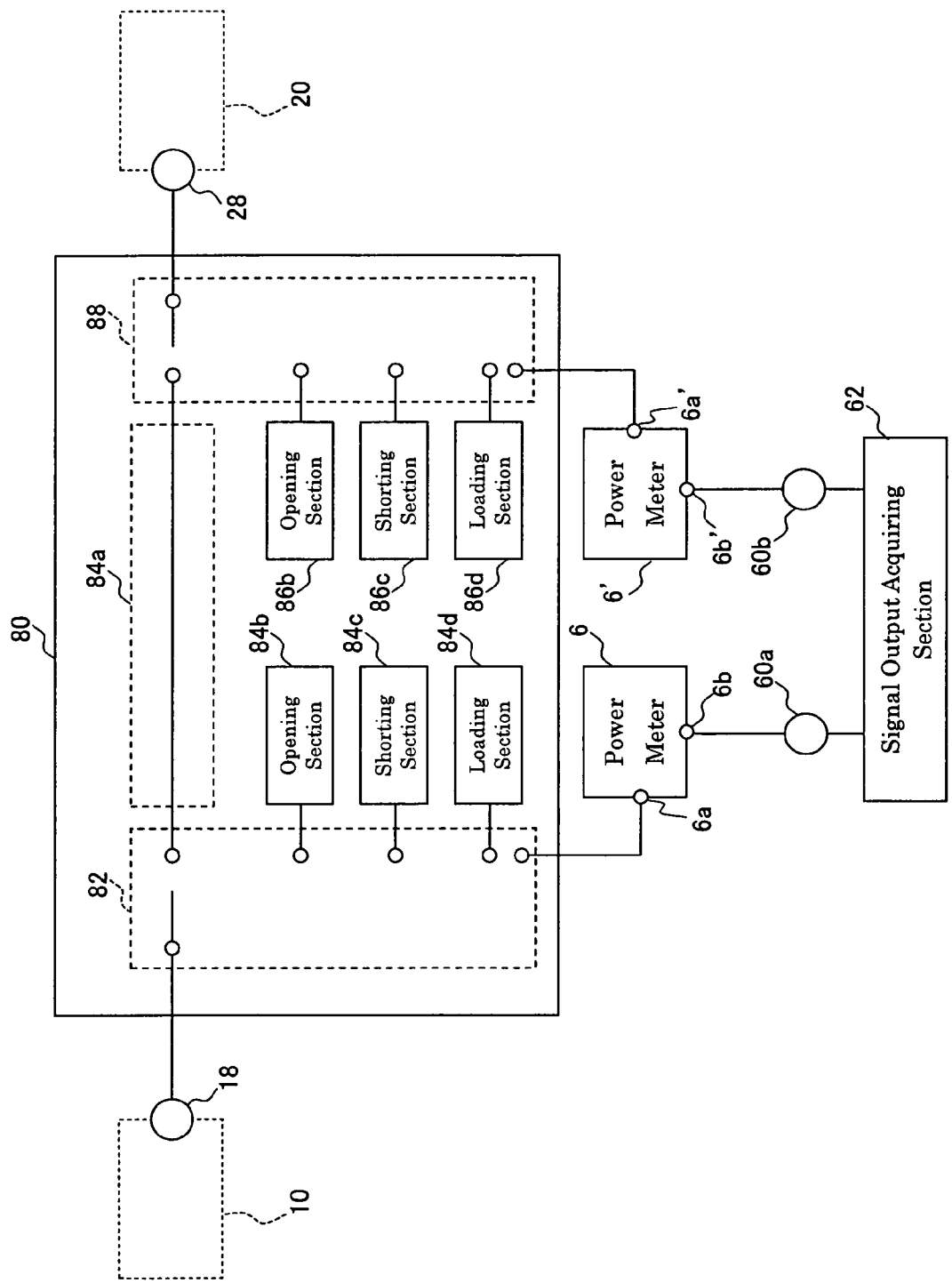
FIG. 28 is a view showing the state where a calibration kit 80 in a second variant of the second embodiment is connected to the signal source 10 and to the receiving means 20.

FIG. 28 is a view showing the state where the calibration kit 80 shown in FIG. 27 with the first power meter 6 and a second power meter 6' being connected thereto constantly is connected to the signal source 10 and to the receiving element 20. Hereinafter, the same numerals are assigned to the same components in FIG. 27 to omit descriptions thereof. The switch 82 connects any one of the direct coupling section 84a, the first opening section 84b, the first shorting section 84c, the first loading section 84d, or the first power meter 6 to the output terminal 18 of the signal source 10. The components to be connected to the output terminal 18 can be switched from one to another. The switching is preferably performed automatically.

It is noted that the terminal 6a of the first power meter 6 is connected to the switch 82, while the terminal 6b of the first power meter 6 to a terminal 60a for power meter.

The switch 88 connects any one of the direct coupling section 84a, the second opening section 86b, the second shorting section 86c, the second loading section 86d, or the second power meter 6' to the input terminal 28 of the receiving element 20. The components to be connected to the input terminal 28 can be switched from one to another. The switching is preferably performed automatically. Additionally, in the case the switch 82 connects the output terminal 18 and the direct coupling section 84a to each other, the switch 88 is also adapted in such a manner as to connect the input terminal 28 and the direct coupling section 84a to each other.

It is noted that a terminal 6a' of the second power meter 6' is connected to the switch 88, while a terminal 6b' of the second power meter 6' to a terminal 60b for power meter. Further, the respective function of the terminals 6a' and 6b' is the same as that of the terminals 6a and 6b.

Also, the terminals 60a and 60b for power meter are connected to the signal output acquiring section 62.

When the switch 82 connects the output terminal 18 and the terminal 6a to each other, the signal source 10 and the power meter 6 are to be connected to each other. When the switch 88 connects the input terminal 28 and the terminal 6a' to each other, the receiving element 20 and the second power meter 6' are to be connected to each other.

In that way, connecting the correction tool 4, the power meter 6 and the receiving element 20 to the signal source 10 can be automated. Further, connecting the correction tool 4, the power meter 6 and the signal source 10 to the receiving element 20 can be automated.

(h) Third Variant of the Second Embodiment

Figure 29:
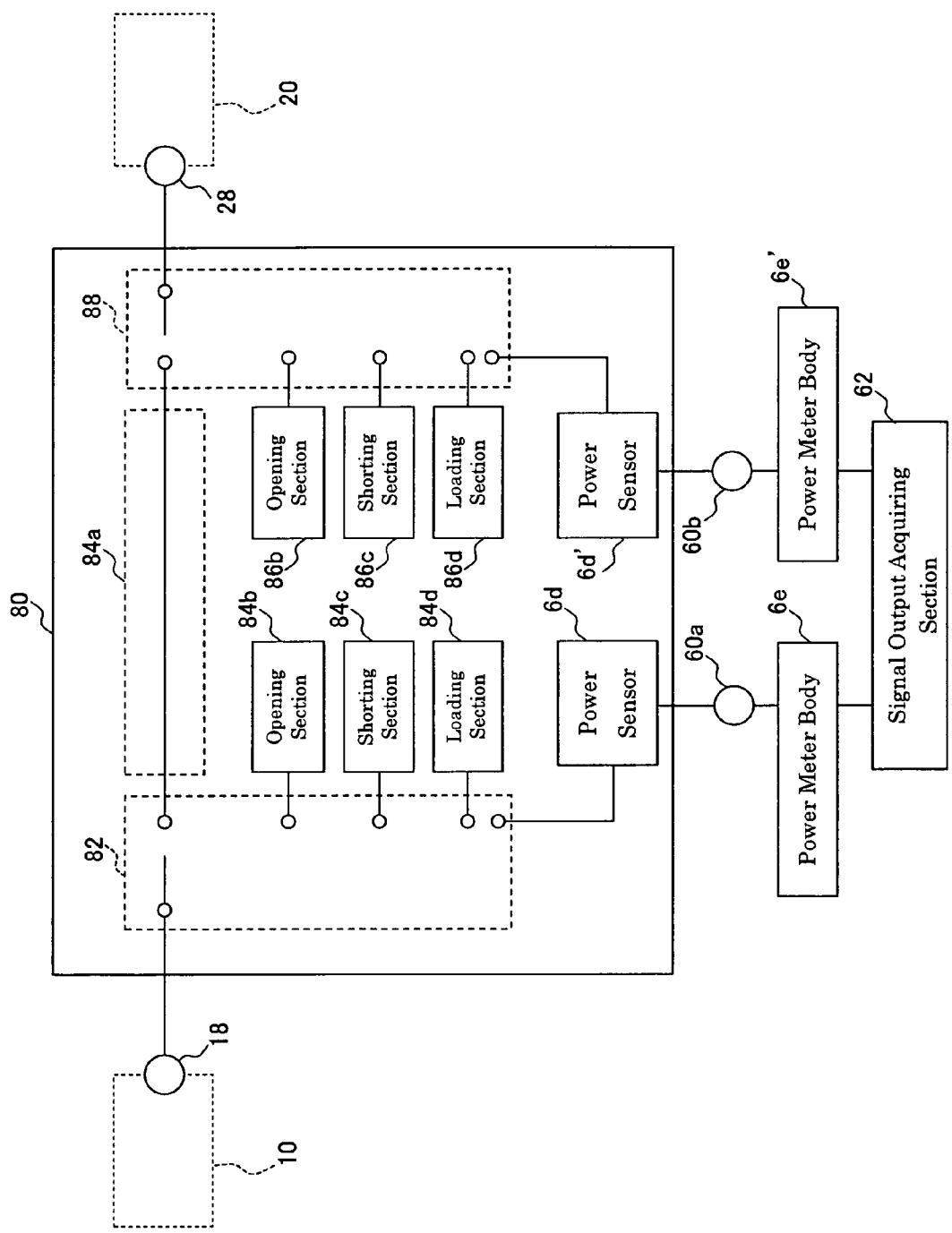
FIG. 29 is a view showing the state where a calibration kit 80 in a third variant of the second embodiment is connected to the signal source 10 and to the receiving means 20.

FIG. 29 is a view showing the state where the calibration kit 80 shown in FIG. 27 with power sensors 6d and 6d' being included therein is connected to the signal source 10 and to the receiving element 20. Hereinafter, the same numerals are assigned to the same components in FIG. 27 and FIG. 28 to omit descriptions thereof.

The switch 88 connects any one of the direct coupling section 84*a*, the second opening section 86*b*, the second shorting section 86*c*, the second loading section 86*d*, or the second power sensor 6*d'* to the input terminal 28 of the receiving element 20. The components to be connected to the input terminal 28 can be switched from one to another. The switching is preferably performed automatically.

It is noted that the second power sensor 6*d'* is for converting the power of received signal into predetermined physical quantity (voltage for example). Output of the second power sensor 6*d'* is processed by a second power meter body 6*e'* to measure the power of signal received by the second power sensor 6*d'*. This means that the second power sensor 6*d'* and the second power meter body 6*e'* serve as the power meter 6.

The second power sensor 6*d'* built in the calibration kit 80 is connected to the second power meter body 6*e'* through the terminal 60*b* for power meter. The second power meter body 6*e'* is provided in the network analyzer 1, and is connected to the signal output acquiring section 62.

It is noted that the power sensor 6*d* is connected to the power meter body 6*e* through the terminal 60*a* for power meter. The power meter body 6*e* is provided in the network analyzer 1, and is connected to the signal output acquiring section 62.

When the switch 82 connects the output terminal 18 and the power sensor 6*d* to each other, the signal source 10 is to be connected to the power sensor 6*d* and the power meter body 6*e* (serving as the power meter 6).

In that way, connecting the correction tool 4, the power meter 6, and the receiving element 20 to the signal source 10 can be automated. Furthermore, it is not necessary to keep connecting the power meter 6 itself to the calibration kit 80.

When the switch 88 connects the input terminal 28 and the second power sensor 6*d'* to each other, the receiving element 20 is to be connected to the second power sensor 6*d'* and the second power meter body 6*e'* (serving as the power meter 6).

In that way, connecting the correction tool 4, the power meter 6, and the signal source 10 to the receiving element 20 can be automated. Furthermore, it is not necessary to keep connecting the power meter 6 itself to the calibration kit 80.

In accordance with the present invention, as measurement system error factors are separated depending on the direction thereof and further a measurement system error factor of the receiving element is acquired, in combination with the measurement results, concerning a device under test, of the input signal measuring element, the reflected signal measuring element and the received signal measuring element, it is possible to measure predetermined parameters (S parameters for example) concerning the device under test while correcting errors.

The invention claimed is:

1. A network analyzer comprising:
    an input signal measuring element for measuring a predetermined parameter concerning an input signal before the occurrence of measurement system error factors;
    a reflected signal measuring element for measuring a predetermined parameter concerning a reflected signal for said input signal;
    a signal output acquiring element for acquiring the predetermined parameter concerning said input signal after the occurrence of the measurement system error factors; and
    a measurement system error factor acquiring element for acquiring the measurement system error factors based on the measurement results of said input signal measuring element, said reflected signal measuring element and said signal output acquiring element.

2. The network analyzer according to claim 1, wherein said reflected signal measuring element measures the predetermined parameter concerning said reflected signal for said input signal reflected from a correction tool connected to said network analyzer, said correction tool achieving three kinds of conditions of opening, shorting and standard loading.

3. The network analyzer according to claim 1, further comprising a receiving element for receiving said input signal, after being output, as a received signal, said receiving element having a received signal measuring element for measuring a predetermined parameter concerning said received signal,
    wherein said measurement system error factor acquiring element acquires measurement system error factors based on the measurement results of said input signal measuring element, said reflected signal measuring element, said signal output acquiring element and said received signal measuring element.

4. The network analyzer according to claim 3, wherein said reflected signal measuring element measures a predetermined parameter concerning a reflected signal for said input signal reflected from a device under test, and wherein said receiving element receives said input signal, after being output, through said device under test as said received signal, further comprising a parameter measuring element for measuring predetermined parameters concerning said device under test based on the measurement results, concerning said device under test, of said input signal measuring element, said reflected signal measuring element and said received signal measuring element, and said measurement system error factors.

5. The network analyzer according to claim 4, wherein the frequency of an input signal of said device under test is different from that of the output signal thereof.

6. The network analyzer according to claim 5, wherein said device under test is a mixer.

7. The network analyzer according to claim 3, wherein said receiving element comprises:
    a receiving side input signal measuring element for measuring a predetermined parameter concerning said input signal before the occurrence of measurement system error factors;
    a receiving side reflected signal measuring element for measuring a predetermined parameter concerning a receiving side reflected signal for said input signal after being output from said receiving element and being reflected;
    a receiving side signal output acquiring element for acquiring the predetermined parameter concerning said input signal after the occurrence of the measurement system error factors; and
    a receiving side measurement system error factor acquiring element for acquiring the measurement system error factors based on the measurement results of said receiving side input signal measuring element, said receiving side reflected signal measuring element and said receiving side signal output acquiring element.

8. The network analyzer according to claim 7, wherein said receiving side reflected signal measuring element is said received signal measuring element.

9. The network analyzer according to claim 7, wherein said receiving side reflected signal measuring element measures the predetermined parameter concerning said reflected signal for said input signal reflected from a correction tool connected to said network analyzer, said correction tool achieving three kinds of conditions of opening, shorting and standard loading.

10. The network analyzer according to claim 7,
wherein said reflected signal measuring element measures a predetermined parameter by receiving said input signal after being output from said receiving element, and
wherein said receiving side measurement system error factor acquiring element acquires measurement system error factors based on the measurement results of said receiving side input signal measuring element, said receiving side reflected signal measuring element, said receiving side signal output acquiring element and said reflected signal measuring element.

11. The network analyzer according to claim 10,
wherein in the case said input signal is given to a device under test directly, said reflected signal measuring element measures a predetermined parameter concerning a reflected signal for said input signal reflected from said device under test and said receiving element receives said input signal, after being output, through said device under test as said received signal, and
wherein in the case said input signal is given to said device under test through said receiving element, said receiving side reflected signal measuring element measures a predetermined parameter concerning a receiving side reflected signal for said input signal reflected from said device under test and said reflected signal measuring element measures a predetermined parameter by receiving said input signal, after being output from said receiving element, through said device under test, further comprising
a parameter measuring element for measuring predetermined parameters concerning said device under test based on:
the measurement results, concerning said device under test, of said input signal measuring element, said reflected signal measuring element and said received signal measuring element in the case said input signal is given to said device under test directly;
the measurement results, concerning said device under test, of said receiving side input signal measuring element, said receiving side reflected signal measuring element and said reflected signal measuring element in the case said input signal is given to said device under test through said receiving element; and
said measurement system error factors.

12. The network analyzer according to claim 11, further comprising a selecting element for selecting whether said input signal is given to said device under test directly or through said receiving element.

13. The network analyzer according to claim 1, wherein said predetermined parameters are S parameters or powers.

14. A network analyzing method comprising:
an input signal measuring step for measuring a predetermined parameter concerning an input signal before the occurrence of measurement system error factors;
a reflected signal measuring step for measuring a predetermine parameter concerning a reflected signal for said input signal;
a signal output acquiring step for acquiring the predetermined parameter concerning said input signal after the occurrence of the measurement system error factors; and
a measurement system error factor acquiring step for acquiring the measurement system error factors based on the measurement results of said input signal measuring step, said reflected signal measuring step and said signal output acquiring step.

15. The network analyzing method according to claim 14,
wherein a network analyzing is performed by a network analyzer having a receiving element for receiving said input signal, after being output, as a received signal, said method further comprising
a received signal measuring step for measuring a predetermined parameter concerning said received signal,
wherein said measurement system error factor acquiring step acquires measurement system error factors based on the measurement results of said input signal measuring step, said reflected signal measuring step, said signal output acquiring step and said received signal measuring step.

16. The network analyzing method according to claim 15,
wherein said reflected signal measuring step measures a predetermined parameter concerning a reflected signal for said input signal reflected from a device under test, and wherein said receiving element receives said input signal, after being output, through said device under test as said received signal, said method further comprising
a parameter measuring element for measuring predetermined parameters concerning said device under test based on the measurement results, concerning said device under test, of said input signal measuring element, said reflected signal measuring step and said received signal measuring step, and said measurement system error factors.

17. The network analyzing method according to claim 15, further comprising:
a receiving side input signal measuring step for measuring a predetermined parameter concerning said input signal before the occurrence of measurement system error factors;
a receiving side reflected signal measuring step for measuring a predetermined parameter concerning a receiving side reflected signal for said input signal after being output from said receiving element and being reflected;
a receiving side signal output acquiring step for acquiring the predetermined parameter concerning said input signal after the occurrence of the measurement system error factors; and
a receiving side measurement system error factor acquiring step for acquiring the measurement system error factors based on the measurement results of said receiving side input signal measuring step, said receiving side reflected signal measuring step and said receiving side signal output acquiring step.

18. The network analyzing method according to claim 17,
wherein said reflected signal measuring step measures a predetermined parameter by receiving said input signal after being output from said receiving element, and
wherein said receiving side measurement system error factor acquiring step acquires measurement system error factors based on the measurement results of said receiving side input signal measuring step, said receiving side reflected signal measuring step, said receiving side signal output acquiring step and said reflected signal measuring step.

19. The network analyzing method according to claim 18,
wherein in the case said input signal is given to a device under test directly, said reflected signal measuring step measures a predetermined parameter concerning a reflected signal for said input signal reflected from said device under test and said receiving element receives said input signal, after being output, through said device under test as said received signal, and wherein in the case said input signal is given to said device under test through said receiving element, said receiving side reflected signal measuring step measures a predetermined parameter concerning a receiving side reflected signal for said input signal reflected from said device under test and said reflected signal measuring step measures a predetermined parameter by receiving said input signal, after being output from said receiving element, through said device under test, said method further comprising:

a parameter measuring step for measuring predetermined parameters concerning said device under test based on:

the measurement results, concerning said device under test, of said input signal measuring step, said reflected signal measuring step and said received signal measuring step in the case said input signal is given to said device under test directly;

the measurement results, concerning said device under test, of said receiving side input signal measuring step, said receiving side reflected signal measuring step and said reflected signal measuring step in the case said input signal is given to said device under test through said receiving element; and said measurement system error factors.

20. A computer-readable medium having a program of instructions for execution by a computer to perform a network analyzing process of a network analyzer having: an input signal measuring element for measuring a predetermined parameter concerning an input signal before the occurrence of measurement system error factors; a reflected signal measuring element for measuring a predetermined parameter concerning a reflected signal for said input signal; and a signal output acquiring element for acquiring the predetermined parameter concerning said input signal after the occurrence of the measurement system error factors, said network analyzing process comprising:

a measurement system error factor acquiring step for acquiring the measurement system error factors based on the measurement results of said input signal measuring element, said reflected signal measuring element and said signal output acquiring element.

21. The computer-readable medium having the program according to claim 20, wherein said network analyzer further comprising a receiving element for receiving said input signal, after being output, as a received signal, said receiving element having a received signal measuring element for measuring a predetermined parameter concerning said received signal, and wherein said measurement system error factor acquiring step acquires measurement system error factors based on the measurement results of said input signal measuring element, said reflected signal measuring element, said signal output acquiring element and said received signal measuring element.

22. The computer-readable medium having the program according to claim 21, wherein said reflected signal measuring element measures a predetermined parameter concerning a reflected signal for said input signal reflected from a device under test, and wherein said receiving element receives said input signal, after being output, through said device under test as said received signal, said network analyzing process further comprising a parameter measuring step for measuring predetermined parameters concerning said device under test based on the measurement results, concerning said device under test, of said input signal measuring element, said reflected signal measuring element and said received signal measuring element, and said measurement system error factors.

23. The computer-readable medium having the program according to claim 21, wherein said receiving element comprises:

a receiving side input signal measuring element for measuring a predetermined parameter concerning said input signal before the occurrence of measurement system error factors;

a receiving side reflected signal measuring element for measuring a predetermined parameter concerning a receiving side reflected signal for said input signal after being output from said receiving element and being reflected; and a receiving side signal output acquiring element for acquiring the predetermined parameter concerning said input signal after the occurrence of the measurement system error factors, said network analyzing process further comprising a receiving side measurement system error factor acquiring step for acquiring the measurement system error factors based on the measurement results of said receiving side input signal measuring element, said receiving side reflected signal measuring element and said receiving side signal output acquiring element.

24. The computer-readable medium having the program according to claim 23, wherein said reflected signal measuring element measures a predetermined parameter by receiving said input signal after being output from said receiving element, and wherein said receiving side measurement system error factor acquiring step acquires measurement system error factors based on the measurement results of said receiving side input signal measuring element, said receiving side reflected signal measuring element, said receiving side signal output acquiring element and said reflected signal measuring element.

25. The computer-readable medium having the program according to claim 24, wherein in the case said input signal is given to a device under test directly, said reflected signal measuring element measures a predetermined parameter concerning a reflected signal for said input signal reflected from said device under test and said receiving element receives said input signal, after being output, through said device under test as said received signal, and wherein in the case said input signal is given to said device under test through said receiving element, said receiving side reflected signal measuring element measures a predetermined parameter concerning a receiving side reflected signal for said input signal reflected from said device under test and said reflected signal measuring element measures a predetermined parameter by receiving said input signal, after being output from said receiving element, through said device under test, said network analyzing process further comprising a parameter measuring step for measuring predetermined parameters concerning said device under test based on:

the measurement results, concerning said device under test, of said input signal measuring element, said reflected signal measuring element and said received signal measuring element in the case said input signal is given to said device under test directly;

the measurement results, concerning said device under test, of said receiving side input signal measuring element, said receiving side reflected signal measuring element and said reflected signal measuring element in the case said input signal is given to said device under test through said receiving element; and said measurement system error factors.

26. An automatic corrector being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; (d) a measurement system error factor acquiring element for acquiring the measurement system error factors based on the measurement results of said input signal measuring element, said reflected signal measuring element and said signal output acquiring element, and (e) a receiving element for receiving said input signal, after being output, as a received signal, said automatic corrector comprising:

a plurality of correction tools for achieving different conditions respectively and an input signal providing element for providing said input signal by selecting any one of said correction tools or said receiving element automatically.

27. The automatic corrector according to claim 26, wherein said input signal providing element provides said input signal by selecting any one of said correction tools, said receiving element, or said signal output acquiring element automatically.

28. The automatic corrector according to claim 27, wherein said input signal providing element provides said input signal to said signal output acquiring element through a power meter.

29. The automatic corrector according to claim 27, wherein said input signal providing element provides said input signal to said signal output acquiring element through a power sensor and a power meter body, said power sensor being built in said automatic corrector and said power meter body being built in said network analyzer.

30. An automatic corrector being connected to a network analyzer comprising a signal source and a receiving element for receiving an input signal, after being output, as a received signal, wherein said signal source having (a) an input signal measuring element for measuring a predetermined parameter concerning said input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; and (d) a measurement system error factor acquiring element for acquiring the measurement system error factors based on the measurement results of said input signal measuring element, said reflected signal measuring element and said signal output acquiring element, wherein said receiving element having (e-1) a receiving side input signal measuring element for measuring a predetermined parameter concerning said input signal before the occurrence of measurement system error factors; (e-2) a receiving side reflected signal measuring element for measuring a predetermined parameter concerning a receiving side reflected signal for said input signal after being output from said receiving element and being reflected; (e-3) a receiving side signal output acquiring element for acquiring the predetermined parameter concerning said input signal after the occurrence of the measurement system error factors; and (e-4) a receiving side measurement system error factor acquiring element for acquiring the measurement system error factors based on the measurement results of said receiving side input signal measuring element, said receiving side reflected signal measuring element and said receiving side signal output acquiring element, said automatic corrector comprising:

a plurality of first correction tools for achieving different conditions respectively in regard to the signal source of said input signal;

a plurality of second correction tools for achieving different conditions respectively in regard to said receiving element;

a first input signal providing element for providing said input signal from said signal source by selecting any one of said first correction tools or said receiving element automatically; and a second input signal providing element for providing said input signal routed through said receiving element by selecting any one of said second correction tools or said signal source automatically.

31. The automatic corrector according to claim 30, wherein said first input signal providing element provides said input signal by selecting any one of said first correction tools, said receiving element, or said signal output acquiring element automatically, and wherein said second input signal providing element provides said input signal routed through said receiving element by selecting any one of said second correction tools, said signal source, or said receiving side signal output acquiring element automatically.

32. The automatic corrector according to claim 31, wherein said first input signal providing element provides said input signal to said signal output acquiring element through a first power meter, while said second input signal providing element provides said input signal to said receiving side signal output acquiring element through a second power meter.

33. The automatic corrector according to claim 31, wherein said first input signal providing element provides said input signal to said signal output acquiring element through a first power sensor and a first power meter body, while said second input signal providing element provides said input signal to said receiving side signal output acquiring element through a second power sensor and a second power meter body, said first and second power sensors being built in said automatic corrector and said first and second power meter bodies being built in said network analyzer.

34. A correction method of an automatic corrector having a plurality of correction tools for achieving different conditions respectively and being connected to a network analyzer having: (a) an input signal measuring element for measuring a predetermined parameter concerning an input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; (d) a measurement system error factor acquiring element for acquiring the measurement system error factors based on the measurement results of said input signal measuring element, said reflected signal measuring element and said signal output acquiring element, and (e) a receiving element for receiving said input signal, after being output, as a received signal, said correction method comprising an input signal providing step for providing said input signal by selecting any one of said correction tools or said receiving element automatically.

35. A correction method of an automatic corrector having a plurality of first correction tools for achieving different conditions respectively in regard to a signal source of an input signal, and a plurality of second correction tools for achieving different conditions respectively in regard to a receiving element; and being connected to a network analyzer comprising said signal source and said receiving element for receiving said input signal, after being output, as a received signal, wherein said signal source having (a) an input signal measuring element for measuring a predetermined parameter concerning said input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; and (d) a measurement system error factor acquiring element for acquiring the measurement system error factors based on the measurement results of said input signal measuring element, said reflected signal measuring element and said signal output acquiring element, and wherein said receiving element having (e-1) a receiving side input signal measuring element for measuring a predetermined parameter concerning said input signal before the occurrence of measurement system error factors; (e-2) a receiving side reflected signal measuring element for measuring a predetermined parameter concerning a receiving side reflected signal for said-input signal after being output from said receiving element and being reflected; (e-3) a receiving side signal output acquiring element for acquiring the predetermined parameter concerning said input signal after the occurrence of the measurement system error factors; and (e-4) a receiving side measurement system error factor acquiring element for acquiring the measurement system error factors based on the measurement results of said receiving side input signal measuring element, said receiving side reflected signal measuring element and said receiving side signal output acquiring element, said correction method comprising:
a first input signal providing step for providing said input signal from said signal source by selecting any one of said first correction tools or said receiving element automatically; and
a second input signal providing step for providing said input signal routed through said receiving element by selecting any one of said second correction tools or said signal source automatically.

36. A computer-readable medium having a program of instructions for execution by a computer to perform a correction process of an automatic corrector having a plurality of correction tools for achieving different conditions respectively and being connected to a network analyzer having:

(a) an input signal measuring element for measuring a predetermined parameter concerning an input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; (d) a measurement system error factor acquiring element for acquiring the measurement system error factors based on the measurement results of said input signal measuring element, said reflected signal measuring element and said signal output acquiring element, and (e) a receiving element for receiving said input signal, after being output, as a received signal, said correction process comprising an input signal providing step for providing said input signal by selecting any one of said correction tools or said receiving element automatically.

37. A computer-readable medium having a program of instructions for execution by a computer to perform a correction process of an automatic corrector having a plurality of first correction tools for achieving different conditions respectively in regard to the signal source of said input signal, and a plurality of second correction tools for achieving different conditions respectively in regard to said receiving element; and being connected to a network analyzer having:

(a) an input signal measuring element for measuring a predetermined parameter concerning an input signal before the occurrence of measurement system error factors; (b) a reflected signal measuring element for measuring a predetermined parameter concerning a reflected signal for said input signal; (c) a signal output acquiring element for acquiring the predetermined parameter concerning said input signal after the occurrence of the measurement system error factors; (d) a measurement system error factor acquiring element for acquiring the measurement system error factors based on the measurement results of said input signal measuring element, said reflected signal measuring element and said signal output acquiring element, and (e) a receiving element for receiving said input signal, after being output, as a received signal, wherein said receiving element comprises: (e-1) a receiving side input signal measuring element for measuring a predetermined parameter concerning said input signal before the occurrence of measurement system error factors; (e-2) a receiving side reflected signal measuring element for measuring a predetermined parameter concerning a receiving side reflected signal for said input signal after being output from said receiving element and being reflected; (e-3) a receiving side signal output acquiring element for acquiring the predetermined parameter concerning said input signal after the occurrence of the measurement system error factors; and (e-4) a receiving side measurement system error factor acquiring element for acquiring the measurement system error factors based on the measurement results of said receiving side input signal measuring element, said receiving side reflected signal measuring element and said receiving side signal output acquiring element, said correction process comprising:
a first input signal providing step for providing said input signal from said signal source by selecting any one of said first correction tools or said receiving element automatically; and
a second input signal providing step for providing said input signal routed through said receiving element by selecting any one of said second correction tools or said signal source automatically.

* * * * *